(12) United States Patent
Sugiura et al.

(10) Patent No.: US 11,417,345 B2
(45) Date of Patent: Aug. 16, 2022

(54) ENCODING APPARATUS, DECODING APPARATUS, FRICATIVE SOUND JUDGMENT APPARATUS, AND METHODS AND PROGRAMS THEREFOR

(71) Applicant: NIPPON TELEGRAPH AND TELEPHONE CORPORATION, Chiyoda-ku (JP)

(72) Inventors: Ryosuke Sugiura, Atsugi (JP); Yutaka Kamamoto, Atsugi (JP); Takehiro Moriya, Atsugi (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 134 days.

(21) Appl. No.: 16/962,047

(22) PCT Filed: Dec. 3, 2018

(86) PCT No.: PCT/JP2018/044334
§ 371 (c)(1),
(2) Date: Jul. 14, 2020

(87) PCT Pub. No.: WO2019/142513
PCT Pub. Date: Jul. 25, 2019

(65) Prior Publication Data
US 2020/0411016 A1 Dec. 31, 2020

(30) Foreign Application Priority Data
Jan. 17, 2018 (JP) .............................. JP2018-005769

(51) Int. Cl.
*G10L 19/002* (2013.01)
*G10L 19/26* (2013.01)
*G10L 21/0232* (2013.01)
*H03M 7/30* (2006.01)

(52) U.S. Cl.
CPC .......... *G10L 19/002* (2013.01); *G10L 19/265* (2013.01); *G10L 21/0232* (2013.01); *H03M 7/6005* (2013.01); *H03M 7/6011* (2013.01)

(58) Field of Classification Search
None
See application file for complete search history.

(56) References Cited

U.S. PATENT DOCUMENTS

| 2002/0128839 A1* | 9/2002 | Lindgren | .............. G10L 21/038 704/258 |
| 2005/0213658 A1* | 9/2005 | Vitali | .................. G10L 19/0208 375/240.03 |

(Continued)

FOREIGN PATENT DOCUMENTS

| JP | 2003-108172 A | 4/2003 |
| JP | 2016-85334 A | 5/2016 |

OTHER PUBLICATIONS

Ruinskiy, Dima, Niv Dadush, and Yizhar Lavner. "Spectral and textural feature-based system for automatic detection of fricatives and affricates." 2010 IEEE 26-th Convention of Electrical and Electronics Engineers in Israel. IEEE, 2010. (Year: 2010).*

(Continued)

*Primary Examiner* — Douglas Godbold
(74) *Attorney, Agent, or Firm* — Oblon, McClelland, Maier & Neustadt, L.L.P.

(57) ABSTRACT

An encoding apparatus performing encoding by an encoding process in which bits are preferentially assigned to a low side to obtain a spectrum code, the encoding apparatus judging whether a sound signal is a hissing sound or not, obtaining and encoding, if the encoding apparatus judges that the sound signal is a hissing sound, what is obtained by exchanging all or a part of a spectrum existing on a lower side than a predetermined frequency in a frequency spectrum sequence of the sound signal for all or a part of a (Continued)

spectrum existing on a higher side of the predetermined frequency in the frequency spectrum sequence, the number of all or the part of the high-side frequency spectrum sequence being the same as the number of all or the part of the low-side frequency spectrum sequence.

12 Claims, 15 Drawing Sheets

(56) References Cited

U.S. PATENT DOCUMENTS

| | | | |
|---|---|---|---|
| 2013/0226595 A1* | 8/2013 | Liu | H04N 19/60 |
| | | | 704/500 |
| 2015/0332676 A1* | 11/2015 | Disch | G10L 19/00 |
| | | | 704/500 |
| 2016/0118051 A1 | 4/2016 | Kishi et al. | |
| 2017/0076732 A1* | 3/2017 | Liu | G10L 19/025 |
| 2020/0395034 A1* | 12/2020 | Sugiura | G10L 19/032 |

OTHER PUBLICATIONS

International Search Report dated Feb. 19, 2019 in PCT/JP2018/044334 filed on Dec. 3, 2018, 2 pages.
James D. Johnston, "Transform Coding of Audio Signals Using Perceptual Noise Criteria," IEEE Journal on Selected Areas in Communications, vol. 6, No. 2, Feb. 1988, pp. 314-323.

* cited by examiner

ENCODING APPARATUS, DECODING APPARATUS, FRICATIVE SOUND JUDGMENT APPARATUS, AND METHODS AND PROGRAMS THEREFOR

TECHNICAL FIELD

The present invention relates to a technique to encode or decode a sample sequence derived from frequency spectra of a sound signal and a technique to judge, for example, a fricative sound used for encoding, in signal processing technology such as sound signal encoding technology.

BACKGROUND ART

It has been conventionally performed to, at the time of performing compression encoding of a sound signal, express the sound signal with a frequency spectrum sequence, perform bit assignment in consideration of the degree of perceptual importance for the frequency spectrum sequence and perform encoding in order to increase compression efficiency. The bit assignment in consideration of the degree of perceptual importance is performed by preferentially assigning bits to samples corresponding to low frequencies in the frequency spectrum sequence, and the like. As a result, as for samples corresponding to high frequencies in the frequency spectrum sequence, only few bits are assigned, or bits are not assigned at all. If bits are not assigned at all, direct information about a sample sequence corresponding to the high frequencies are not encoded at all by an encoding apparatus. Therefore, a corresponding decoding apparatus obtains a decoded sound, with sample values corresponding to the high frequencies in the frequency spectrum sequence as 0's. In other words, encoding/decoding in which the frequency band is restricted is performed. This is based on the fact that, because a human being's sensitivity to high frequencies is low when he hears a sound, he may not notice even if a part corresponding to the high frequencies is not reproduced. By assigning the number of bits saved at a high frequency band to a low frequency band, it is possible to accurately express information that is more important to human perceptual characteristics. Thus, a sound signal encoding method is often designed so that a larger number of bits are used for a low-frequency spectrum.

As such a conventional technique, a technique of Non-patent literature 1 exists. An encoding apparatus of Non-patent literature 1 includes a frequency domain converting part 31 and an encoding part 32 as its main part, as shown in FIG. 15.

A time-domain sound signal inputted to the encoding apparatus is inputted to the frequency domain converting part 31. For each predetermined-time-length frame, the frequency domain converting part 31 converts the inputted time-domain sound signal to a frequency-domain frequency spectrum sequence and outputs the frequency-domain frequency spectrum sequence.

The frequency spectrum sequence is inputted to the encoding part 32. For each predetermined-time-length frame, the encoding part 32 performs bit assignment in consideration of the degree of perceptual importance, for each of samples included in the frequency spectrum sequence and encodes each of the samples included in the frequency spectrum sequence with the assigned number of bits to obtain and output a code. At this time, the encoding part 32 does not obtain a code corresponding to a sample to which no bits are assigned.

A decoding apparatus of Non-patent literature 1 includes a decoding part 41 and a time domain converting part 42 as its main part, as shown in FIG. 16.

Codes inputted to the decoding apparatus are inputted to the decoding part 41. For each predetermined-time-length frame, the decoding part 41 decodes the codes to obtain decoded values of the samples of the frequency spectrum sequence. At this time, since a code corresponding to a sample to which bits have not been assigned by the encoding apparatus does not exist, the decoding part 41 sets a decoded value of the sample to 0. The decoding part 41 outputs a sequence by decoded values of the samples as a decoded frequency spectrum sequence.

The decoded frequency spectrum sequence is inputted to the time domain converting part 42. For each predetermined-time-length frame, the time domain converting part 42 converts the inputted decoded frequency spectrum sequence to a time-domain sound signal (a decoded sound signal) and outputs the sound signal.

PRIOR ART LITERATURE

Non-Patent Literature

Non-patent literature 1: J. D. Johnston, "Transform Coding of Audio Signals Using Perceptual Noise Criteria", IEEE Journal on Selected Areas in Communications, pp. 314-323, vol. 6, no. 2, 1988.

SUMMARY OF THE INVENTION

Problems to be Solved by the Invention

According to the encoding apparatus and the decoding apparatus of Non-patent literature 1, it is possible to, for many sounds among natural sounds, obtain a decoded sound with little deterioration of perceptual quality. Among the natural sounds, however, a sound in which energy is concentrated to high frequencies, and there is almost no energy at low frequencies also exists like a fricative sound in human uttered voice. There is a problem that, if allocation of the number of bits as described above is performed for such a sound signal, a decoded sound in which a main frequency component of the sound is largely distorted is obtained especially under a low-bit-rate condition, and the decoded sound is perceptually deteriorated.

Therefore, an object of the present invention is to provide an encoding apparatus and a decoding apparatus for performing encoding and decoding in a manner of, even for a sound signal of a fricative sound or the like, reducing perceptual deterioration, without largely changing an encoding apparatus configuration, a fricative sound judgment apparatus used for the encoding apparatus, and methods and programs therefor.

Means to Solve the Problems

An encoding apparatus according to an aspect of this invention is an encoding apparatus comprising an encoding part encoding a frequency-domain sample sequence corresponding to a sound signal of each frame in a predetermined time section by an encoding process in which bits are preferentially assigned to a low side, to obtain a spectrum code, the encoding apparatus further comprising: a fricative sound judging part judging whether the sound signal is a hissing sound or not; and a fricative sound adjusting part obtaining, if the fricative sound judging part judges that the sound signal is a hissing sound, what is obtained by exchanging all or a part of a low-side frequency spectrum sequence existing on a lower side than a predetermined frequency in a frequency spectrum sequence of the sound signal for all or a part of a high-side frequency spectrum sequence existing on a higher side than the predetermined frequency in the frequency spectrum sequence as an adjusted frequency spectrum sequence, the number of all or the part of the high-side frequency spectrum sequence being the same as the number of all or the part of the low-side frequency spectrum sequence, and, otherwise, immediately obtaining the frequency spectrum sequence corresponding to the sound signal as it is, as the adjusted frequency spectrum sequence; wherein the encoding part encodes the adjusted frequency spectrum sequence obtained by the fricative sound adjusting part as the frequency-domain sample sequence corresponding to the sound signal to obtain a spectrum code.

An encoding apparatus according to an aspect of this invention is an encoding apparatus encoding a frequency spectrum sequence of a sound signal of each frame in a predetermined time section to obtain a spectrum code, the encoding apparatus comprising: a fricative sound judging part judging whether the sound signal is a hissing sound or not; and a fricative sound compatible encoding part encoding the frequency spectrum sequence by an encoding process in which bits are preferentially assigned to a high side to obtain a spectrum code, if the fricative sound judging part judges that the sound signal is a hissing sound, and, otherwise, encoding the frequency spectrum sequence by an encoding process in which bits are preferentially assigned to a low side to obtain a spectrum code.

A decoding apparatus according to an aspect of this invention is a decoding apparatus comprising a decoding part decoding a spectrum code which is a spectrum code for each frame in a predetermined time section and in which bits are preferentially assigned to a low side, to obtain a frequency-domain sample sequence corresponding to a decoded sound signal, the decoding apparatus further comprising a fricative sound adjustment releasing part obtaining, if inputted information indicating whether a hissing sound or not indicates being a hissing sound, what is obtained by exchanging all or a part of a low-side frequency sample sequence existing on a lower side than a predetermined frequency in the frequency-domain sample sequence obtained by the decoding part for all or a part of a high-side frequency sample sequence existing on a higher side than the predetermined frequency in the frequency-domain sample sequence obtained by the decoding part, as a frequency spectrum sequence of the decoded sound signal, the number of all or the part of the high-side frequency sample sequence being the same as the number of all or the part of the low-side frequency sample sequence, and, otherwise, immediately obtaining the frequency-domain sample sequence obtained by the decoding part as it is, as the frequency spectrum sequence of the decoded sound signal.

A decoding apparatus according to an aspect of this invention is a decoding apparatus decoding a spectrum code for each frame in a predetermined time section to obtain a frequency spectrum sequence of a decoded sound signal, the decoding apparatus comprising a fricative sound compatible decoding part decoding the spectrum code to obtain the frequency spectrum sequence on an assumption that bits are preferentially assigned to a high side of the spectrum code, if inputted information indicating whether a hissing sound or not indicates being a hissing sound, and, otherwise, decoding the spectrum code to obtain the frequency spectrum sequence on an assumption that bits are preferentially assigned to a low side of the spectrum code.

A fricative sound judgment apparatus according to an aspect of this invention is a fricative sound judgment apparatus judging whether a sound signal is a hissing sound or not for each frame in a predetermined time section, the fricative sound judgment apparatus comprising a fricative sound judging part judging that the sound signal for the frame is a hissing sound if, among a plurality of frames including the frame, the number of frames in which such an index that increases as a ratio of average energy of frequency spectra on a high side to average energy of frequency spectra on a low side in a frequency spectrum sequence of the sound signal increases is larger than a predetermined threshold, or equal to or larger than the threshold, is larger than the number of frames other than the frames, or equal to or larger than the number of frames other than the frames.

Effects of the Invention

For example, according to the encoding apparatus and the decoding apparatus, it is possible to perform encoding and decoding in a manner of reducing perceptual deterioration even for a sound signal of a fricative sound or the like.

DETAILED DESCRIPTION OF THE EMBODIMENTS

First Embodiment

A system of a first embodiment includes an encoding apparatus and a decoding apparatus. The encoding apparatus encodes a time-domain sound signal inputted in each predetermined-time-length frame to obtain and output a code. The code outputted by the encoding apparatus is inputted to the decoding apparatus. The decoding apparatus decodes the inputted code to output the time-domain sound signal in the frame. The sound signal inputted to the encoding apparatus is, for example, a voice signal or an acoustic signal obtained by collecting sound such as voice and music by microphone and AD-converting the sound. The sound signal outputted by the decoding apparatus can be listened to, for example, by being DA-converted and reproduced by a speaker.

<<Encoding Apparatus>>

Figure 1:
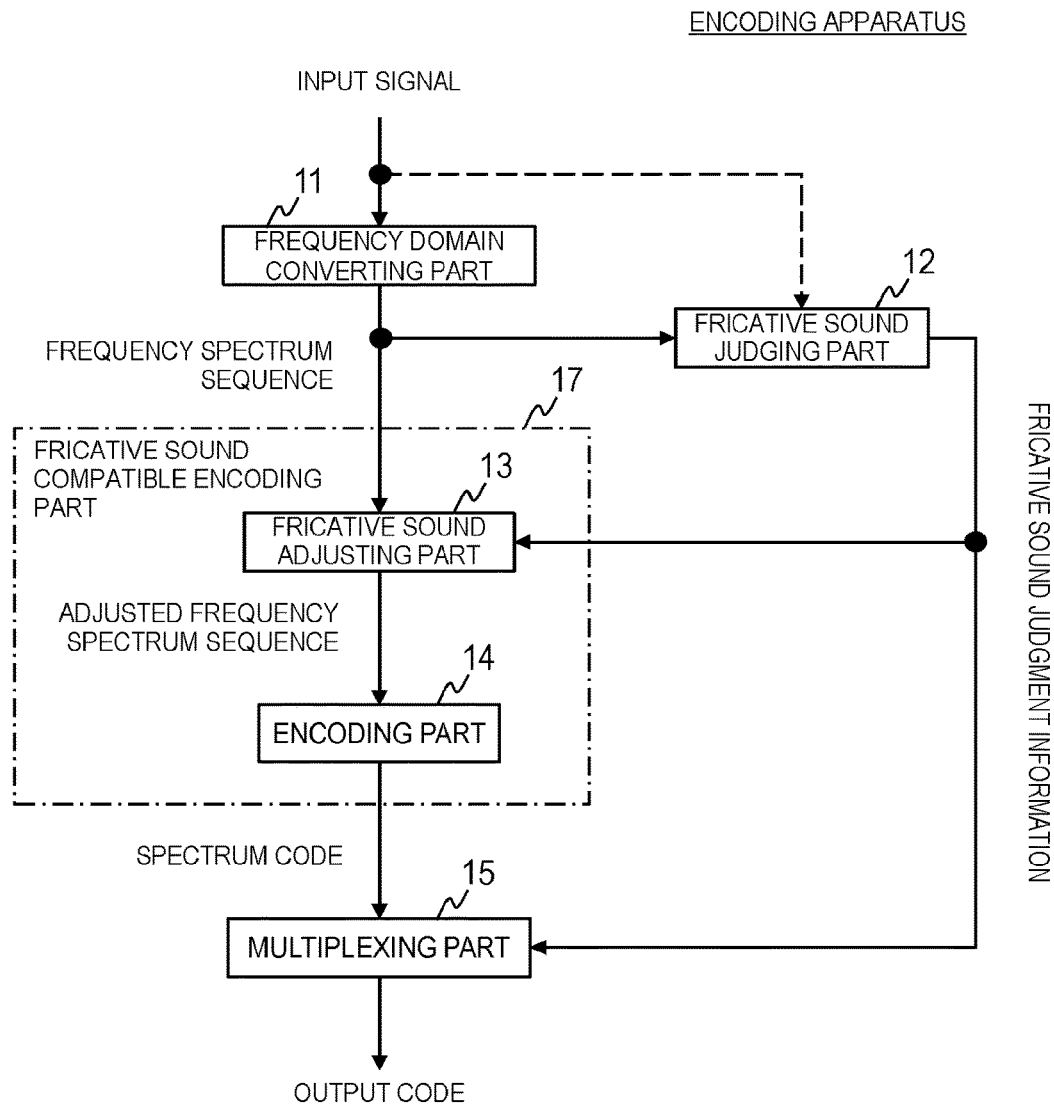
FIG. 1 is a block diagram showing an example of an encoding apparatus of a first embodiment.
Figure 2:
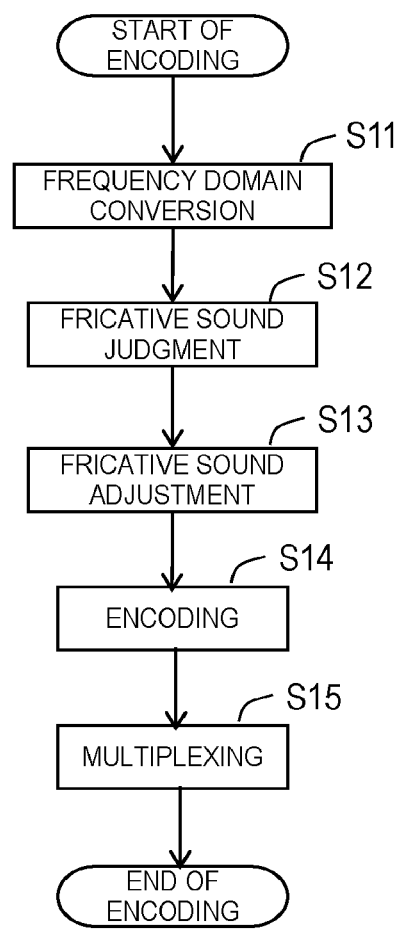
FIG. 2 is a flowchart showing an example of an encoding method of the first embodiment.

A processing procedure of the encoding apparatus of the first embodiment will be described with reference to FIG. 1. As illustrated in FIG. 1, the encoding apparatus of the first embodiment includes a frequency domain converting part 11, a fricative sound judging part 12, a fricative sound adjusting part 13, an encoding part 14 and a multiplexing part 15. A time-domain sound signal inputted to the encoding apparatus is inputted to the frequency domain converting part 11. The encoding apparatus performs processing for each predetermined-time-length frame at each part. An encoding method of the first embodiment is realized by the parts of the encoding apparatus performing a process from steps S11 to S15 described below and illustrated in FIG. 2.

A configuration is also possible in which not a time-domain sound signal but a frequency-domain sound signal is inputted to the encoding apparatus. In the case of adopting this configuration, the encoding apparatus does not have to include the frequency domain converting part 11, and is only required to input a frequency-domain sound signal in each predetermined-time-length frame to the fricative sound judging part 12 and the fricative sound adjusting part 13.

[Frequency Domain Converting Part 11]

A time-domain sound signal inputted to the encoding apparatus is inputted to the frequency domain converting part 11. For each predetermined-time-length frame, the frequency domain converting part 11 converts the inputted time-domain sound signal to a frequency spectrum sequence $X_0, \ldots, X_{N-1}$ at N points in a frequency domain, for example, by modified discrete cosine transform (MDCT) or the like and outputs the frequency spectrum sequence $X_0, \ldots, X_{N-1}$ (step S11). Here, N is a positive integer, and, for example, N=32 or the like is set. Subscripts attached to X indicate numbers allocated to spectra in ascending order of frequencies. As a method for conversion to a frequency domain, any of various well-known conversion methods and the like (for example, Discrete Fourier transform, short-time Fourier transform and the like) other than MDCT may be used.

The frequency domain converting part 11 outputs the frequency spectrum sequence obtained by conversion to the fricative sound judging part 12 and the fricative sound adjusting part 13. The frequency domain converting part 11 may perform filter processing and companding processing for the frequency spectrum sequence obtained by conversion for the purpose of perceptual weighting and output the filter-processed and companding-processed sequence as the frequency spectrum sequence $X_0, \ldots, X_{N-1}$.

[Fricative Sound Judging Part 12 (Fricative Sound Judgment Apparatus)]

For example, the frequency spectrum sequence $X_0, \ldots, X_{N-1}$ outputted by the frequency domain converting part 11 is inputted to the fricative sound judging part 12. For each frame, the fricative sound judging part 12 judges whether the sound signal is a hissing sound or not using the inputted frequency spectrum sequence $X_0, \ldots, X_{N-1}$ and outputs a result of the judgment to the fricative sound adjusting part 13 and the multiplexing part 15 as fricative sound judgment information (step S12). As the fricative sound judgment information, for example, 1-bit information can be used. In other words, for each frame, the fricative sound judging part 12 can output a bit "1" as information indicating that the sound signal is a hissing sound if the sound signal is a hissing sound, and a bit "0" as information indicating that the sound signal is not a hissing sound if the sound signal of the frame is not a hissing sound, as the fricative sound judgment information.

The fricative sound judging part 12 determines, for example, such an index that increases as a ratio of average energy of samples existing on a high side of the inputted frequency spectrum sequence $X_0, \ldots, X_{N-1}$ to average energy of samples existing on a low side of the inputted frequency spectrum sequence $X_0, \ldots, X_{N-1}$ increases, as an index indicating that the frame is a hissing sound. If the determined index is larger than a predetermined threshold, or equal to or larger than the threshold, the fricative sound judging part 12 judges being a hissing sound, and, otherwise, that is, if the determined index is equal to or smaller than the predetermined threshold, or smaller than the threshold, the fricative sound judging part 12 judges not being a hissing sound.

When an integer value larger than 1 and smaller than N−1 is assumed to be MA, and an integer value larger than MA and smaller than N is assumed to be MB, for example, the fricative sound judging part 12 determines a value obtained by dividing the high-side average energy by the low-side average energy as the index indicating that the frame is a hissing sound, when $X_0, \ldots, X_{MA}$, which are samples with sample numbers equal to or smaller than MA in the frequency spectrum sequence $X_0, \ldots, X_{N-1}$ are assumed to be samples existing on the low side, $X_{MB}, \ldots, X_{N-1}$, which are samples with sample numbers equal to or larger than MB in the frequency spectrum sequence $X_0, \ldots, X_{N-1}$ are assumed to be samples existing on the high side, a mean value of a sum of absolute values or a mean value of a sum of squares of values of all or a part of samples of $X_0, \ldots, X_{MA}$ is assumed to be low-side average energy, and a mean value of a sum of absolute values or a mean value of a sum of squares of values of all or a part of samples of $X_{MB}, \ldots, X_{N-1}$ is assumed to be high-side average energy.

It is desirable to set the integer value MA in a manner that the low-side samples targeted by calculation of the low-side average energy by the fricative sound judging part 12 are included in a low-side frequency spectrum sequence at the fricative sound adjusting part 13 to be described later. In other words, it is desirable to set the integer value MA used by the fricative sound judging part 12 to a value smaller than an integer value M of the fricative sound adjusting part 13 to be described later. Further, it is desirable to set the integer value MB in a manner that the high-side samples targeted by calculation of the high-side average energy by the fricative sound judging part 12 are included in a high-side frequency spectrum sequence at the fricative sound adjusting part 13 to be described later. In other words, it is desirable to set the integer value MB used by the fricative sound judging part 12 to a value equal to or larger than the integer value M of the fricative sound adjusting part 13 to be described later.

In the case of using values of a part of samples among the samples $X_0, \ldots, X_{MA}$ existing on the low side for calculation of the above index, it is desirable to use values of one or more samples from a side where the frequency is the lowest among $X_0, \ldots, X_{MA}$ for calculation of the above index. In other words, it is desirable to set a mean value of a sum of absolute values or a mean value of a sum of squares of values of samples of $X_0, \ldots, X_\alpha$ as the lower-side average energy, when $\alpha$ is assumed to be a positive integer smaller than MA. The value of $\alpha$ can be determined in advance based on prior experiments and the like in a manner that the frequency spectra can be in a range where frequency spectra can normally exist if $X_0, \ldots, X_\alpha$ is a sound other than a hissing sound.

In an encoding process by the encoding part 14 to be described later, there may be a case where bits are not assigned at all to some samples in descending order of frequencies in an adjusted frequency spectrum sequence because of restriction of the maximum number of bits obtained in the encoding process. In this case, there may be a case where, no matter whether a frequency spectrum adjustment process by the fricative sound adjusting part 13 to be described later is performed or not, bits are not assigned at all to $\beta$ samples ($\beta$ is a positive integer) in descending order of frequencies in the frequency spectrum sequence. In such a case, it is desirable to use $X_{MB}, \ldots, X_{N-1-\beta}$ obtained by excluding $\beta$ samples in descending order of frequencies among $X_{MB}, \ldots, X_{N-1}$ for calculation of the above index. In other words, it is desirable to set a mean value of a sum of absolute values or a mean value of a sum of squares of values of samples of $X_{MB}, \ldots, X_{N-1-\beta}$ as the high-side average energy. The value of $\beta$ can be determined in advance in association with the encoding process performed by the encoding part 14 and the adjustment process performed by the fricative sound adjusting part 13, designed in advance.

Figure 5:
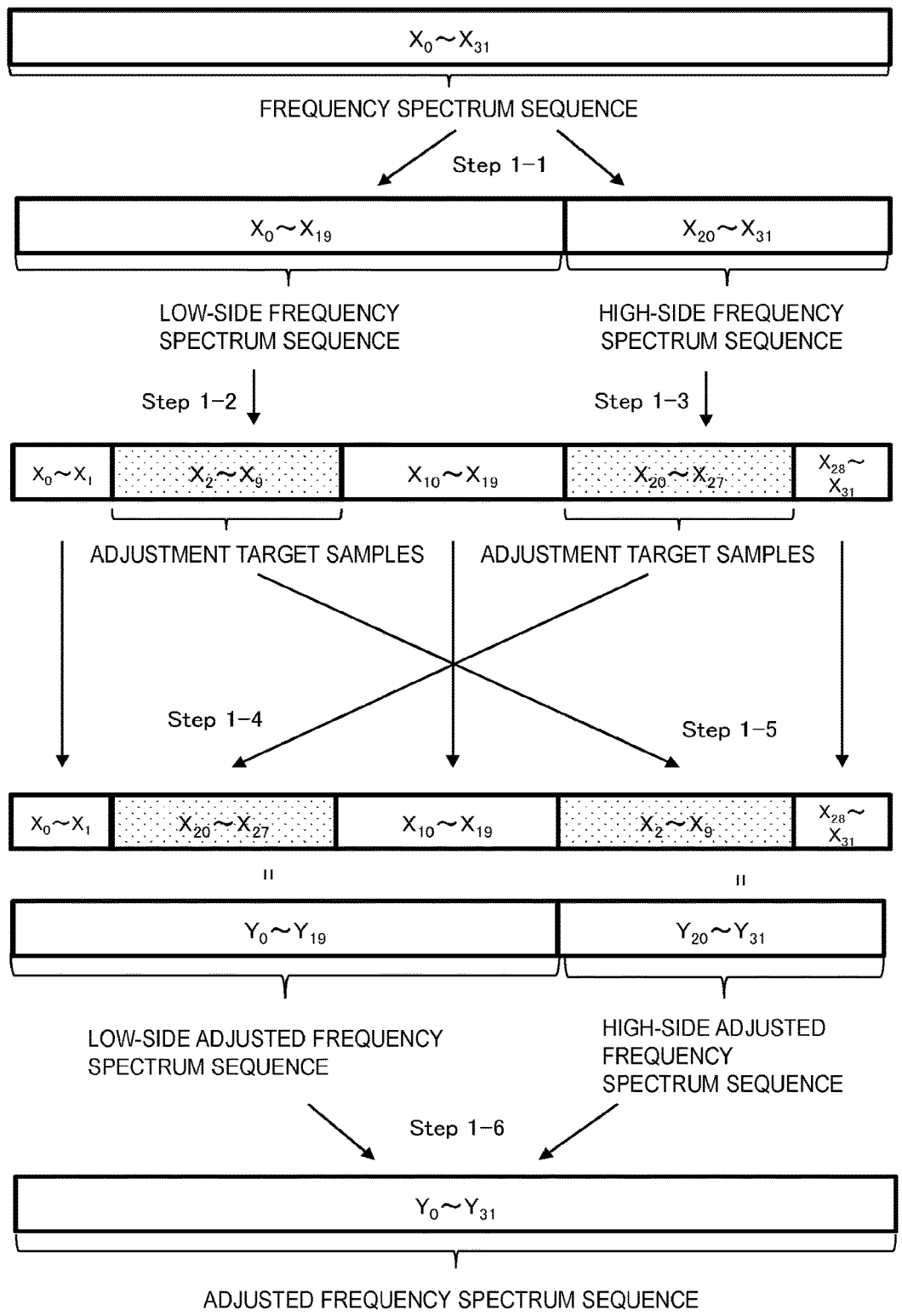
FIG. 5 is a diagram for illustrating an example of a fricative sound adjustment process.
Figure 6:
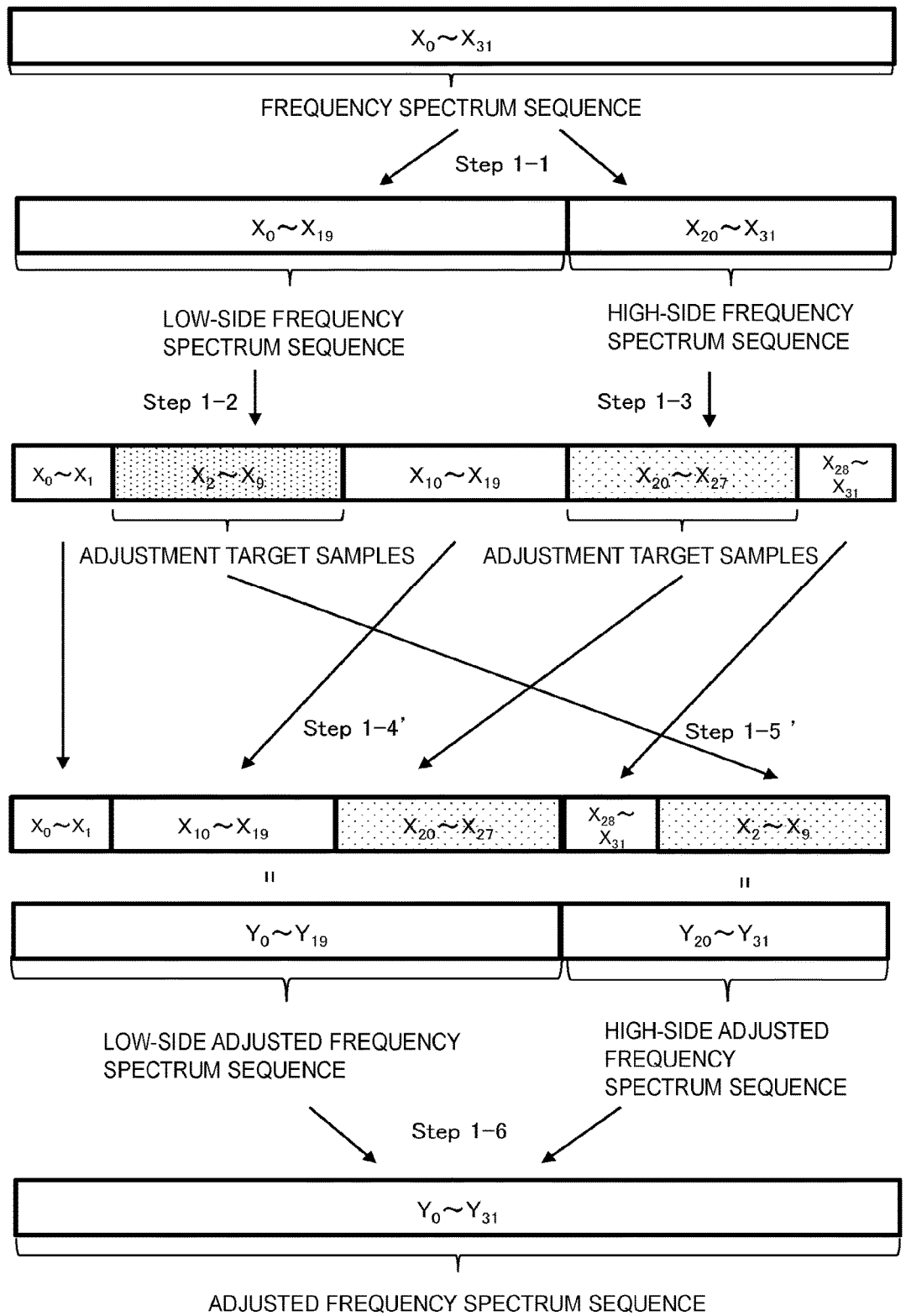
FIG. 6 is a diagram for illustrating an example of the fricative sound adjustment process.

FIGS. 5 and 6 show examples of the fricative sound adjusting part 13 to be described later in the case of N=32 and M=20. In these examples, $X_0, \ldots, X_{19}$ in the frequency spectrum sequence is assumed as a low-side frequency spectrum sequence, and $X_{20}, \ldots, X_{31}$ in the frequency spectrum sequence is assumed as a high-side frequency spectrum sequence. Therefore, on the assumption that MA is a value smaller than 20, for example, 19, and MB is a value equal to or larger than 20, for example, 20, the fricative sound judging part 12 can set a mean value of a sum of absolute values or a mean value of a sum of squares of values of all or a part of samples of $X_0, \ldots, X_{19}$ as the low-side average energy and set a mean value of a sum of absolute values or a mean value of a sum of squares of values of all or a part of samples of $X_{20}, \ldots, X_{31}$ as the high-side average energy. If $\alpha=8$ is set here, the fricative sound judging part 12 can set a mean value of a sum of absolute values or a mean value of a sum of squares of values of samples of $X_0, \ldots, X_8$ as the low-side average energy. If $\beta=4$ is set here, the fricative sound judging part 12 can set a mean value of a sum of absolute values or a mean value of a sum of squares of values of samples of $X_{20}, \ldots, X_{27}$ as the high-side average energy.

As shown by a broken line in FIG. 1, not the frequency spectrum sequence outputted by the frequency domain converting part 11 but the time-domain sound signal inputted to the encoding apparatus may be inputted to the fricative sound judging part 12 to judge, for each frame, whether the sound signal of the frame is a hissing sound or not using the inputted time-domain sound signal. This judgment can be performed, for example, by determining the number of zero crossings of the inputted time-domain sound signal as an index indicating that the frame is a hissing sound; and by judging being a hissing sound if the determined index is larger than a predetermined threshold, or equal to or larger than the threshold, and, otherwise, that is, if the determined index is equal to or smaller than the predetermined threshold, or smaller than the threshold, judging not being a hissing sound.

[Fricative Sound Adjusting Part 13]

The frequency spectrum sequence $X_0, \ldots, X_{N-1}$ outputted by the frequency domain converting part 11 and the fricative sound judgment information outputted by the fricative sound judging part 12 are inputted to the fricative sound adjusting part 13. For each frame, if the inputted fricative sound judgment information indicates being a hissing sound, the fricative sound adjusting part 13 performs a frequency spectrum adjustment process below for the inputted frequency spectrum sequence $X_0, \ldots, X_{N-1}$ to obtain an adjusted frequency spectrum sequence $Y_0, \ldots, Y_{N-1}$ and outputs the obtained adjusted frequency spectrum sequence $Y_0, \ldots, Y_{N-1}$ to the encoding part 14; and, if the fricative sound judgment information indicates not being a hissing sound, the fricative sound adjusting part 13 immediately outputs the frequency spectrum sequence $X_0, \ldots, X_{N-1}$ to the encoding part 14 as it is, as the adjusted frequency spectrum sequence $Y_0, \ldots, Y_{N-1}$ (step S13).

When an integer value larger than 1 and smaller than N is assumed to be M, and, for example, it is assumed that a sample group by $X_0, \ldots, X_{M-1}$, which are samples with sample numbers smaller than M in the frequency spectrum sequence $X_0, \ldots, X_{N-1}$, is a low-side frequency spectrum sequence, and a sample group by $X_M, \ldots, X_{N-1}$, which are samples with sample numbers equal to or larger than M in the frequency spectrum sequence $X_0, \ldots, X_{N-1}$, is a high-side frequency spectrum sequence, an adjustment process that the fricative sound adjusting part 13 performs when the fricative sound judgment information indicates being a hissing sound is a process for obtaining what is obtained by exchanging all or a part of samples of the low-side frequency spectrum sequence $X_0, \ldots, X_{M-1}$ for all or a part of samples of the high-side frequency spectrum sequence $X_M, \ldots, X_{N-1}$, the number of all or the part of the samples of the high-side frequency spectrum sequence $X_M, \ldots, X_{N-1}$ being the same as the number of all or the part of the samples of the low-side frequency spectrum sequence $X_0, \ldots, X_{M-1}$, as the adjusted frequency spectrum sequence $Y_0, \ldots, Y_{N-1}$. The adjustment process performed by the fricative sound adjusting part 13 will be illustrated below. As the adjustment process performed by the fricative sound adjusting part 13, there can be various processes including the process illustrated below, and which process is to be performed is determined in advance.

[Example 1 of Adjustment Process Performed by Fricative Sound Adjusting Part 13]

If the fricative sound judgment information indicates being a hissing sound, the fricative sound adjusting part 13 obtains the adjusted frequency spectrum sequence $Y_0, \ldots, Y_{N-1}$, for example, by performing Steps 1-1 to 1-6 described below. Six divided steps, Steps 1-1 to 1-6 are shown below in order to make the operation of the fricative sound adjusting part 13 easy to understand. However, to separately perform Steps 1-1 to 1-6 described below is merely an example, and the fricative sound adjusting part 13 may perform a process equivalent to Steps 1-1 to 1-6 by one step by exchanging array elements or performing re-indexing.

Step 1-1: The sample group by the samples with the sample numbers smaller than M in the frequency spectrum sequence $X_0, \ldots, X_{N-1}$ is assumed to be the low-side frequency spectrum sequence $X_0, \ldots, X_{M-1}$, and the sample group by the samples with the sample numbers equal to or larger than M in the frequency spectrum sequence $X_0, \ldots, X_{N-1}$ is assumed to be the high-side frequency spectrum sequence $X_M, \ldots, X_{N-1}$.

Step 1-2: C samples (C is a positive integer) included in the low-side frequency spectrum sequence $X_0, \ldots, X_{M-1}$ obtained at Step 1-1 are taken out as samples targeted by adjustment to the high side.

Step 1-3: C samples included in the high-side frequency spectrum sequence $X_M, \ldots, X_{N-1}$ obtained at Step 1-1 are taken out as samples targeted by adjustment to the low side.

Step 1-4: What is obtained by arranging the samples targeted by adjustment to the low side, which were taken out from the high-side frequency spectrum sequence at Step 1-3, at sample positions from which the samples targeted by adjustment to the high side in the low-side frequency spectrum sequence were taken out at Step 1-2 is obtained as a low-side adjusted frequency spectrum sequence $Y_0, \ldots, Y_{M-1}$.

Step 1-5: What is obtained by arranging the samples targeted by adjustment to the high side, which were taken out from the low-side frequency spectrum sequence at Step 1-2, at sample positions from which the samples targeted by adjustment to the low side in the high-side frequency spectrum sequence were taken out at Step 1-3 is obtained as a high-side adjusted frequency spectrum sequence $Y_M, \ldots, Y_{N-1}$.

Step 1-6: The low-side adjusted frequency spectrum sequence $Y_0, \ldots, Y_{M-1}$ obtained at Step 1-4 and the high-side adjusted frequency spectrum sequence $Y_M, \ldots, Y_{N-1}$ obtained at Step 1-5 are combined to obtain the adjusted frequency spectrum sequence $Y_0, \ldots, Y_{N-1}$.

An example of Steps 1-1 to 1-6 in the case of N=32, M=20 and C=8 is shown in FIG. 5. First, the fricative sound adjusting part 13 sets $X_0, \ldots, X_{19}$ in a frequency spectrum sequence $X_0, \ldots, X_{31}$ as a low-side frequency spectrum sequence, and sets $X_{20}, \ldots, X_{31}$ as a high-side frequency spectrum sequence (Step 1-1). The fricative sound adjusting part 13 takes out eight samples $X_2, \ldots, X_9$ included in the low-side frequency spectrum sequence $X_0, \ldots, X_{19}$ as samples targeted by adjustment to the high side (Step 1-2). The fricative sound adjusting part 13 takes out eight samples $X_{20}, \ldots, X_{27}$ included in the high-side frequency spectrum sequence $X_{20}, \ldots, X_{31}$ as samples targeted by adjustment to the low side (Step 1-3). The fricative sound adjusting part 13 obtains what is obtained by arranging $X_{20}, \ldots, X_{27}$ at sample positions where $X_2, \ldots, X_9$ existed in the low-side frequency spectrum sequence, as a low-side adjusted frequency spectrum sequence $Y_0, \ldots, Y_{19}$ (Step 1-4). The fricative sound adjusting part 13 obtains what is obtained by arranging $X_2, \ldots, X_9$ at sample positions where $X_{20}, \ldots, X_{27}$ existed in the high-side frequency spectrum sequence, as a high-side adjusted frequency spectrum sequence $Y_{20}, \ldots, Y_{31}$ (Step 1-5). The fricative sound adjusting part 13 combines the low-side adjusted frequency spectrum sequence $Y_0, \ldots, Y_{19}$ and the high-side adjusted frequency spectrum sequence $Y_{20}, \ldots, Y_{31}$ to obtain an adjusted frequency spectrum sequence $Y_0, \ldots, Y_{31}$ (Step 1-6).

[Example 2 of Adjustment Process Performed by Fricative Sound Adjusting Part 13]

The fricative sound adjusting part 13 may perform Step 1-4' described below instead of Step 1-4 described above.

Step 1-4': What is obtained by moving remaining samples left after having taken out the samples targeted by adjustment to the high side in the low-side frequency spectrum sequence at Step 1-2, to the low side, and arranging the samples targeted by adjustment to the low side, which were taken out from the high-side frequency spectrum sequence at Step 1-3, at emptied sample positions on the high side is obtained as the low-side adjusted frequency spectrum sequence $Y_0, \ldots, Y_{M-1}$.

By the fricative sound adjusting part 13 performing Step 1-4' instead of Step 1-4, it becomes possible for the encoding part 14 at a subsequent stage to perform encoding in a manner of setting a higher perceptual importance for a sample the corresponding frequency of which is lower.

Thus, if the fricative sound judging part 12 judges being a hissing sound, the fricative sound adjusting part 13 may obtain an adjusted frequency spectrum sequence by, on the assumption that the adjusted frequency spectrum sequence is configured with a low-side adjusted frequency spectrum sequence and a high-side adjusted frequency spectrum sequence, including a part of samples in the low-side frequency spectrum sequence into the high-side adjusted frequency spectrum sequence, arranging remaining samples in the low-side frequency spectrum sequence on the low side in the low-side adjusted frequency spectrum sequence, arranging a part of samples in the high-side frequency spectrum sequence on the high side in the low-side adjusted frequency spectrum sequence, and including remaining samples left in the high-side frequency spectrum sequence into the high-side adjusted frequency spectrum sequence.

[Example 3 of Adjustment Process Performed by Fricative Sound Adjusting Part 13]

Similarly, the fricative sound adjusting part 13 may perform Step 1-5' described below instead of Step 1-5 described above.

Step 1-5': What is obtained by arranging the samples targeted by adjustment to the high side, which were taken out from the low-side frequency spectrum sequence at Step 1-2, at sample positions on the high side emptied by moving remaining samples left after having taken out the samples targeted by adjustment to the low side in the high-side frequency spectrum sequence at Step 1-3, to the low side is obtained as the high-side adjusted frequency spectrum sequence $Y_M, \ldots, Y_{N-1}$.

By the fricative sound adjusting part 13 performing Step 1-5' instead of Step 1-5, it becomes possible for the encoding part 14 at a subsequent stage to perform encoding in a manner of setting a higher perceptual importance for the samples that originally existed on the high side than the samples that originally existed on the low side.

FIG. 6 shows an example of performing Step 1-4' instead of Step 1-4 and Step 1-5' instead of Step 1-5 among Steps 1-1 to 1-6 in the case of N=32, M=20 and C=8. First, the fricative sound adjusting part 13 sets $X_0, \ldots, X_{19}$ in the frequency spectrum sequence $X_0, \ldots, X_{31}$ as a low-side frequency spectrum sequence, and sets $X_{20}, \ldots, X_{31}$ as a high-side frequency spectrum sequence (Step 1-1). The fricative sound adjusting part 13 takes out the eight samples $X_2, \ldots, X_9$ included in the low-side frequency spectrum sequence $X_0, \ldots, X_{19}$ as samples targeted by adjustment to the high side (Step 1-2). The fricative sound adjusting part 13 takes out the eight samples $X_{20}, \ldots, X_{27}$ included in the high-side frequency spectrum sequence $X_{20}, \ldots, X_{31}$ as samples targeted by adjustment to the low side (Step 1-3). The fricative sound adjusting part 13 moves $X_{10}, \ldots, X_{19}$ in the low-side frequency spectrum sequence to the low side, and obtains what is obtained by arranging $X_{20}, \ldots, X_{27}$ on the high side of $X_{10}, \ldots, X_{19}$ which have been moved to the low side, as the low-side adjusted frequency spectrum sequence $Y_0, \ldots, Y_{19}$ (Step 1-4'). The fricative sound adjusting part 13 moves $X_{28}, \ldots, X_{31}$ in the high-side frequency spectrum sequence to the low side, and obtains what is obtained by arranging $X_2, \ldots, X_9$ on the high side of $X_{28}, \ldots, X_{31}$ which have been moved to the low side, as the high-side adjusted frequency spectrum sequence $Y_{20}, \ldots, Y_{31}$ (Step 1-5'). The fricative sound adjusting part 13 combines the low-side adjusted frequency spectrum sequence $Y_0, \ldots, Y_{19}$ and the high-side adjusted frequency spectrum sequence $Y_2, \ldots, Y_{31}$ to obtain the adjusted frequency spectrum sequence $Y_0, \ldots, Y_{31}$ (Step 1-6).

In this way, if the fricative sound judging part 12 judges being a hissing sound, the fricative sound adjusting part 13 may obtain an adjusted frequency spectrum sequence by, on the assumption that the adjusted frequency spectrum sequence is configured with a low-side adjusted frequency spectrum sequence and a high-side adjusted frequency spectrum sequence, arranging a part of samples in the low-side frequency spectrum sequence on the high side in the high-side adjusted frequency spectrum sequence, including remaining samples left in the low-side frequency spectrum sequence into the low-side adjusted frequency spectrum sequence, including a part of samples in the high-side frequency spectrum sequence into the low-side adjusted frequency spectrum sequence, and arranging remaining samples left in the high-side frequency spectrum sequence on the low side in the high-side adjusted frequency spectrum sequence.

[Example 4 of Adjustment Process Performed by Fricative Sound Adjusting Part 13]

Further, it is desirable for the fricative sound adjusting part 13 not to include one or more samples in ascending order of frequencies into the samples targeted by adjustment to the high side from the low-side frequency spectrum sequence at Step 1-2 described above. This is because a low-frequency sample is a sample that contributes to signal waveform continuity between frames, and the encoding part 14 should perform encoding in which more bits are assigned. In other words, when $\gamma$ is a positive integer, it is recommended to select C adjustment target samples from $X_\gamma, \ldots, X_{M-1}$ in the low-side frequency spectrum sequence, and, for example, $X_\gamma, \ldots, X_{\gamma+C-1}$ can be set as adjustment target samples. If the value of $\gamma$ is increased, the signal waveform continuity between frames is enhanced. However, since the number of bits assigned to other samples by the encoding part 14 becomes relatively small, perceptual quality of a decoded sound in the frames degrades. Therefore, it is recommended to determine the value of $\gamma$ based on prior experiments and the like in consideration of the above.

In the examples of FIGS. 5 and 6 described above, $\gamma=2$ is set; and $X_0$ and $X_1$, which are the first two samples in ascending order of frequencies in the low-side frequency spectrum sequence, are not included in the samples targeted by adjustment to the high side from the low-side frequency spectrum sequence.

In other words, if the fricative sound judging part 12 judges being a hissing sound, the fricative sound adjusting part 13 may obtain what is obtained by exchanging a part existing on the high side in the low-side frequency spectrum sequence for all or a part of the high-side frequency spectrum sequence as the adjusted frequency spectrum sequence, the number of all or the part of the high-side frequency spectrum sequence being the same as the number of the part existing on the high-side in the low-side frequency spectrum sequence.

[Example 5 of Adjustment Process Performed by Fricative Sound Adjusting Part 13]

In the encoding process by the encoding part 14 to be described later, there may be a case where bits are not assigned at all to some samples in descending order of frequencies in the adjusted frequency spectrum sequence because of restriction of the maximum number of bits obtained in the encoding process. In this case, it is recommended to cause one or more samples in descending order of frequencies in the high-side frequency spectrum sequence $X_M, \ldots, X_{N-1}$ not to be targeted by encoding but cause remaining samples existing on the low side in the high-side frequency spectrum sequence $X_M, \ldots, X_{N-1}$ to be targeted by encoding. Therefore, in this case, the fricative sound adjusting part 13 does not include one or more samples in descending order of frequencies in the high-side frequency spectrum sequence into the samples targeted by adjustment to the low side from the high side frequency spectrum sequence at Step 1-3 described above.

In the examples of FIGS. 5 and 6 described above, $X_{28}, \ldots, X_{31}$, which are the first four samples in descending order of frequencies in the high-side frequency spectrum sequence are not included in the samples targeted by adjustment to the low side from the high-side frequency spectrum sequence.

In other words, if the fricative sound judging part 12 judges being a hissing sound, the fricative sound adjusting part 13 may obtain what is obtained by exchanging all or a part in the low-side frequency spectrum sequence for a part existing on the low side in the high-side frequency spectrum sequence as the adjusted frequency spectrum sequence, the number of the part existing on the low side being the same as the number of all or the part in the low-side frequency spectrum sequence.

[Encoding Part 14]

The adjusted frequency spectrum sequence $Y_0, \ldots, Y_{N-1}$ outputted by the fricative sound adjusting part 13 is inputted to the encoding part 14. For each frame, the encoding part 14 encodes the inputted adjusted frequency spectrum sequence $Y_0, \ldots, Y_{N-1}$ in a method in which bits are preferentially assigned to samples with small sample numbers, for example, in the same method as Non-patent literature 1 to obtain a spectrum code, and outputs the obtained spectrum code to the multiplexing part 15 (step S14).

Here, the method in which bits are preferentially assigned to samples with small sample numbers is, for example, a method of dividing the adjusted frequency spectrum sequence $Y_0, \ldots, Y_{N-1}$ into a plurality of partial sequences, dividing each sample included in each partial sequence by a gain, the value of the gain being smaller for a partial sequence with a smaller sample number, and obtaining a spectrum code, which is a code corresponding to an adjusted frequency spectrum sequence by encoding each of integer values, which are division results, using a variable-length code or a fixed-length code or performing vector quantization. At this time, as for a part of partial sequences with larger sample numbers, codes corresponding to the partial sequences may not be obtained. In other words, as for the part of partial sequences with larger sample numbers, bits may not be assigned.

As for partial sequences with smaller sample numbers in the adjusted frequency spectrum sequence $Y_0, \ldots, Y_{N-1}$, each of large integer values obtained by dividing values of samples included in the partial sequences by small-value gains is encoded. Therefore, each integer value is assigned a large number of bits and encoded. On the other hand, as for partial sequences with larger sample numbers in the adjusted frequency spectrum sequence $Y_0, \ldots, Y_{N-1}$, each of small integer values obtained by dividing values of samples included in the partial sequences by large-value gains is encoded. Therefore, each integer value is assigned a small number of bits and encoded. Integer value obtained by dividing each of sample values included in a partial sequence by a large-value gain is often 0.

If the fricative sound adjusting part 13 and the encoding part 14 are assumed to constitute a fricative sound compatible encoding part 17 as indicated by a dot-dash line in FIG. 1, it can be said that the fricative sound compatible encoding part 17 encodes a frequency spectrum sequence by an encoding process in which bits are preferentially assigned to the high side to obtain a spectrum code if the fricative sound judging part 12 judges being a hissing sound, and, otherwise, encodes the frequency spectrum sequence by an encoding process in which bits are preferentially assigned to the low side to obtain a spectrum code.

[Multiplexing Part 15]

The fricative sound judgment information outputted by the fricative sound judging part 12 and the spectrum code outputted by the encoding part 14 are inputted to the multiplexing part 15. For each frame, the multiplexing part 15 outputs a code obtained by combining a code corresponding to the inputted fricative sound judgment information and the spectrum code (step S15). If the fricative sound judgment information outputted by the fricative sound judging part 12 is 1-bit information, the fricative sound judgment information itself that has been outputted by the fricative sound judging part 12 and inputted to the multiplexing part 15 can be the code corresponding to the fricative sound judgment information.

<<Decoding Apparatus>>

Figure 3:
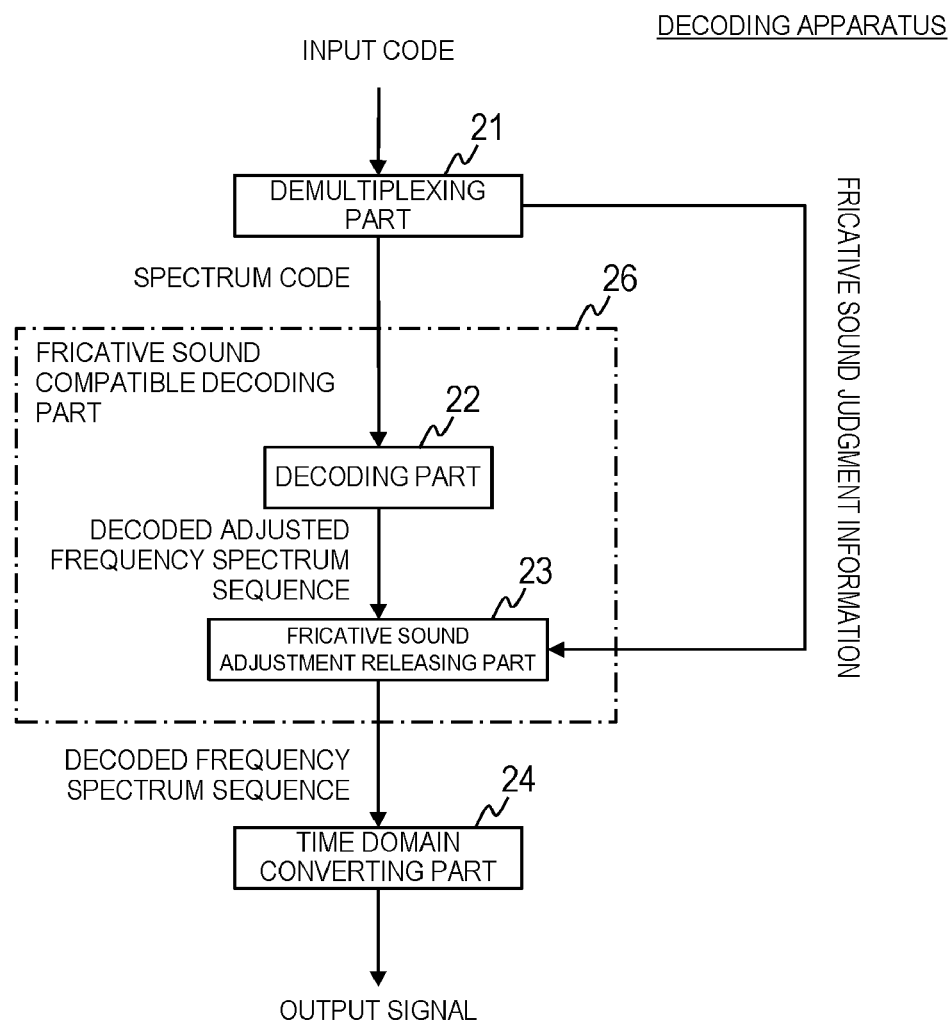
FIG. 3 is a block diagram showing an example of a decoding apparatus of the first embodiment.
Figure 4:
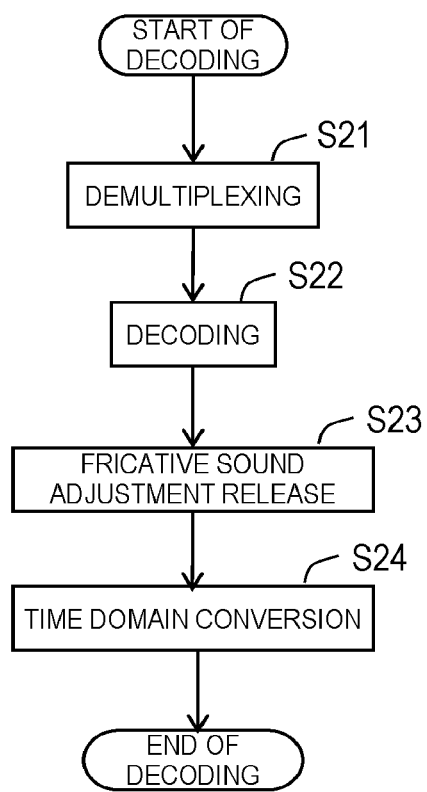
FIG. 4 is a flowchart showing an example of a decoding method of the first embodiment.

A processing procedure of the decoding apparatus of the first embodiment will be described with reference to FIG. 3. As illustrated in FIG. 3, the decoding apparatus of the first embodiment includes a demultiplexing part 21, a decoding part 22, a fricative sound adjustment releasing part 23 and a time domain converting part 24. A code outputted by the encoding apparatus is inputted to the decoding apparatus. The code inputted to the decoding apparatus is inputted to the demultiplexing part 21. The decoding apparatus performs processing for each predetermined-time-length frame by each part. A decoding method of the first embodiment is realized by the parts of the decoding apparatus performing a process from step S21 to step S24 described below and illustrated in FIG. 4.

[Demultiplexing Part 21]

A code outputted by the encoding apparatus is inputted to the demultiplexing part 21. For each frame, the demultiplexing part 21 separates the inputted code into a code corresponding to fricative sound judgment information and a spectrum code, and outputs fricative sound judgment information obtained from the code corresponding to the fricative sound judgment information to the fricative sound adjustment releasing part 23, and the spectrum code to the decoding part 22 (step S21).

If the fricative sound judgment information is 1-bit information, the code itself corresponding to the fricative sound judgment information inputted to the demultiplexing part 21 can be the fricative sound judgment information.

[Decoding Part 22]

The spectrum code outputted by the demultiplexing part 21 is inputted to the decoding part 22. For each frame, the decoding part 22 decodes the inputted spectrum code by a decoding method corresponding to an encoding method performed by the encoding part 14 of the encoding apparatus to obtain a decoded adjusted frequency spectrum sequence $\hat{Y}_0, \ldots, \hat{Y}_{N-1}$ and outputs the decoded adjusted frequency spectrum sequence $\hat{Y}_0, \ldots, \hat{Y}_{N-1}$ to the fricative sound adjustment releasing part 23 (step S22).

In the case of decoding the spectrum code by a decoding method corresponding to the encoding method described above in the description of the encoding part 14 of the encoding apparatus, the decoding part 22 decodes the spectrum code to obtain an integer value sequence, and combines a plurality of partial sequences of sample values, each of the plurality of partial sequences being obtained by multiplying integer values by a gain, and the gain having a smaller value for a partial sequence with smaller sample numbers, to obtain the decoded adjusted frequency spectrum sequence $\hat{Y}_0, \ldots, \hat{Y}_{N-1}$. If bits are not assigned to a part of the partial sequences with larger sample numbers by the encoding apparatus, values of decoded adjusted frequency spectra corresponding to the partial sequences are set to 0, for example. As for samples the integer values of which are 0's, values obtained by multiplying the samples by a gain are also 0's. Therefore, values of decoded adjusted frequency spectra are also 0's. In other words, as for a part of partial sequences with larger sample numbers, the integer values are often 0's, and values of decoded adjusted frequency spectra are often 0's.

In this way, by decoding a spectrum code which is a spectrum code for each frame in a predetermined time section and in which bits are preferentially assigned to the low side, the decoding part 22 obtains a frequency-domain sample sequence corresponding to a decoded sound signal (a decoded adjusted frequency spectrum sequence).

[Fricative Sound Adjustment Releasing Part 23]

The fricative sound judgment information outputted by the demultiplexing part 21 and the decoded adjusted frequency spectrum sequence $\hat{Y}_0, \ldots, \hat{Y}_{N-1}$ outputted by the decoding part 22 are inputted to the fricative sound adjustment releasing part 23. For each frame, the fricative sound adjustment releasing part 23 performs an adjustment releasing process below for the inputted decoded adjusted frequency spectrum sequence $\hat{Y}_0, \ldots, \hat{Y}_{N-1}$ to obtain a decoded frequency spectrum sequence $\hat{X}_0, \ldots, \hat{X}_{N-1}$ and outputs the obtained decoded frequency spectrum sequence $\hat{X}_0, \ldots, \hat{X}_{N-1}$ to the time domain converting part 24 if the inputted fricative sound judgment information indicates being a hissing sound; and the fricative sound adjustment releasing part 23 immediately outputs the decoded adjusted frequency spectrum sequence $\hat{Y}_0, \ldots, \hat{Y}_{N-1}$ as it is, as the decoded frequency spectrum sequence $\hat{X}_0, \ldots, \hat{X}_{N-1}$ to the time domain converting part 24 if the fricative sound judgment information indicates not being a hissing sound (step S23).

When an integer value larger than 1 and smaller than N is assumed to be M, and, for example, it is assumed that a sample group by $\hat{Y}_0, \ldots, \hat{Y}_{M-1}$, which are samples with sample numbers smaller than M in the decoded adjusted frequency spectrum sequence $\hat{Y}_0, \ldots, \hat{Y}_{N-1}$, is a low-side decoded adjusted frequency spectrum sequence, and a sample group by $\hat{Y}_M, \ldots, \hat{Y}_{N-1}$, which are samples with sample numbers equal to or larger than M in the decoded adjusted frequency spectrum sequence $\hat{Y}_0, \ldots, \hat{Y}_{N-1}$, is a high-side decoded adjusted frequency spectrum sequence, an adjustment releasing process that the fricative sound adjustment releasing part 23 performs when the fricative sound judgment information indicates being a hissing sound is a process for obtaining what is obtained by exchanging all or a part of samples of the low-side decoded adjusted frequency spectrum sequence $\hat{Y}_0, \ldots, \hat{Y}_{N-1}$ for all or a part of samples of the high-side decoded adjusted frequency spectrum sequence $\hat{Y}_M, \ldots, \hat{Y}_{N-1}$ as the decoded frequency spectrum sequence $\hat{X}_0, \ldots, \hat{X}_{N-1}$, the number of all or the part of the samples of the high-side decoded adjusted frequency spectrum sequence $\hat{Y}_M, \ldots, \hat{Y}_{N-1}$ being the same as the number of all or the part of the samples of the low-side decoded adjusted frequency spectrum sequence $\hat{Y}_0, \ldots, \hat{Y}_{N-1}$. As the adjustment releasing process performed by the fricative sound adjustment releasing part 23, there can be various processes including a process illustrated below. The adjustment releasing process is determined in advance so that the adjustment releasing process is a process opposite to a corresponding adjustment process performed by the fricative sound adjusting part 13 of the encoding apparatus.

In other words, the fricative sound adjustment releasing part 23 obtains what is obtained by exchanging all or a part of a low-side frequency sample sequence existing on a lower side than a predetermined frequency (a low-side decoded adjusted frequency spectrum sequence) in a frequency-domain sample sequence obtained by the decoding part 22 for all or a part of a high-side frequency sample sequence existing on a higher side than the predetermined frequency (a high-side decoded adjusted frequency spectrum sequences) in the frequency-domain sample sequence obtained by the decoding part 22, as a frequency spectrum sequence of a decoded sound signal (a decoded frequency spectrum sequence), the number of all or the part of the high-side frequency sample sequence being the same as the number of all or the part of the low-side frequency sample sequence, if inputted information indicating whether a hissing sound or not indicates being a hissing sound, and, otherwise, the fricative sound adjustment releasing part 23 immediately obtains the frequency-domain sample sequence (the decoded adjusted frequency spectrum sequence) obtained by the decoding part 22 as it is, as the frequency spectrum sequence of the decoded sound signal (the decoded frequency spectrum sequence).

[Example 1 of Adjustment Releasing Process Performed by Fricative Sound Adjustment Releasing Part 23]

If the fricative sound judgment information indicates being a hissing sound, the fricative sound adjustment releasing part 23 obtains the decoded frequency spectrum sequence $\hat{X}_0, \ldots, \hat{X}_{N-1}$, for example, by performing Steps 2-1 to 2-6 described below. Six divided steps, Steps 2-1 to 2-6 are shown below in order to make the operation of the fricative sound adjustment releasing part 23 easy to understand. However, to separately perform Steps 2-1 to 2-6 described below is merely an example, and the fricative sound adjustment releasing part 23 may perform a process equivalent to Steps 2-1 to 2-6 by one step by exchanging array elements or performing re-indexing.

Step 2-1: The sample group by the samples with sample numbers smaller than M in the decoded adjusted frequency spectrum sequence $\hat{Y}_0, \ldots, \hat{Y}_{N-1}$ is assumed to be the low-side decoded adjusted frequency spectrum sequence $\hat{Y}_0, \ldots, \hat{Y}_{M-1}$, and the sample group by the samples with sample numbers equal to or larger than M in the decoded adjusted frequency spectrum sequence $\hat{Y}_0, \ldots, \hat{Y}_{N-1}$ is assumed to be the high-side decoded adjusted frequency spectrum sequence $\hat{Y}_M, \ldots, \hat{Y}_{N-1}$.

Step 2-2: C samples (C is a positive integer) included in the low-side decoded adjusted frequency spectrum sequence $\hat{Y}_0, \ldots, \hat{Y}_{M-1}$ obtained at Step 2-1 are taken out as samples targeted by adjustment to the high side.

Step 2-3: C samples included in the high-side decoded adjusted frequency spectrum sequence $\hat{Y}_M, \ldots, \hat{Y}_{N-1}$ obtained at Step 2-1 are taken out as samples targeted by adjustment to the low side.

Step 2-4: What is obtained by arranging the samples targeted by adjustment to the low side taken out from the high-side decoded adjusted frequency spectrum sequence at Step 2-3 at sample positions from which the samples targeted by adjustment to the high side in the low-side decoded adjusted frequency spectrum sequence were taken out at Step 2-2 is obtained as a low-side decoded frequency spectrum sequence $\hat{X}_0, \ldots, \hat{X}_{M-1}$.

Step 2-5: What is obtained by arranging the samples targeted by adjustment to the high side, which were taken out from the low-side decoded adjusted frequency spectrum sequence at Step 2-2, at sample positions from which the samples targeted by adjustment to the low side in the high-side decoded adjusted frequency spectrum sequence were taken out at Step 2-3 is obtained as a high-side decoded frequency spectrum sequence $\hat{X}_M, \ldots, \hat{X}_{N-1}$.

Step 2-6: The low-side decoded frequency spectrum sequence $\hat{X}_0, \ldots, \hat{X}_{M-1}$ obtained at Step 2-4 and the high-side decoded frequency spectrum sequence $\hat{X}_M, \ldots, \hat{X}_{N-1}$ obtained at Step 2-5 are combined to obtain the decoded frequency spectrum sequence $\hat{X}_0, \ldots, \hat{X}_{N-1}$.

Figure 7:
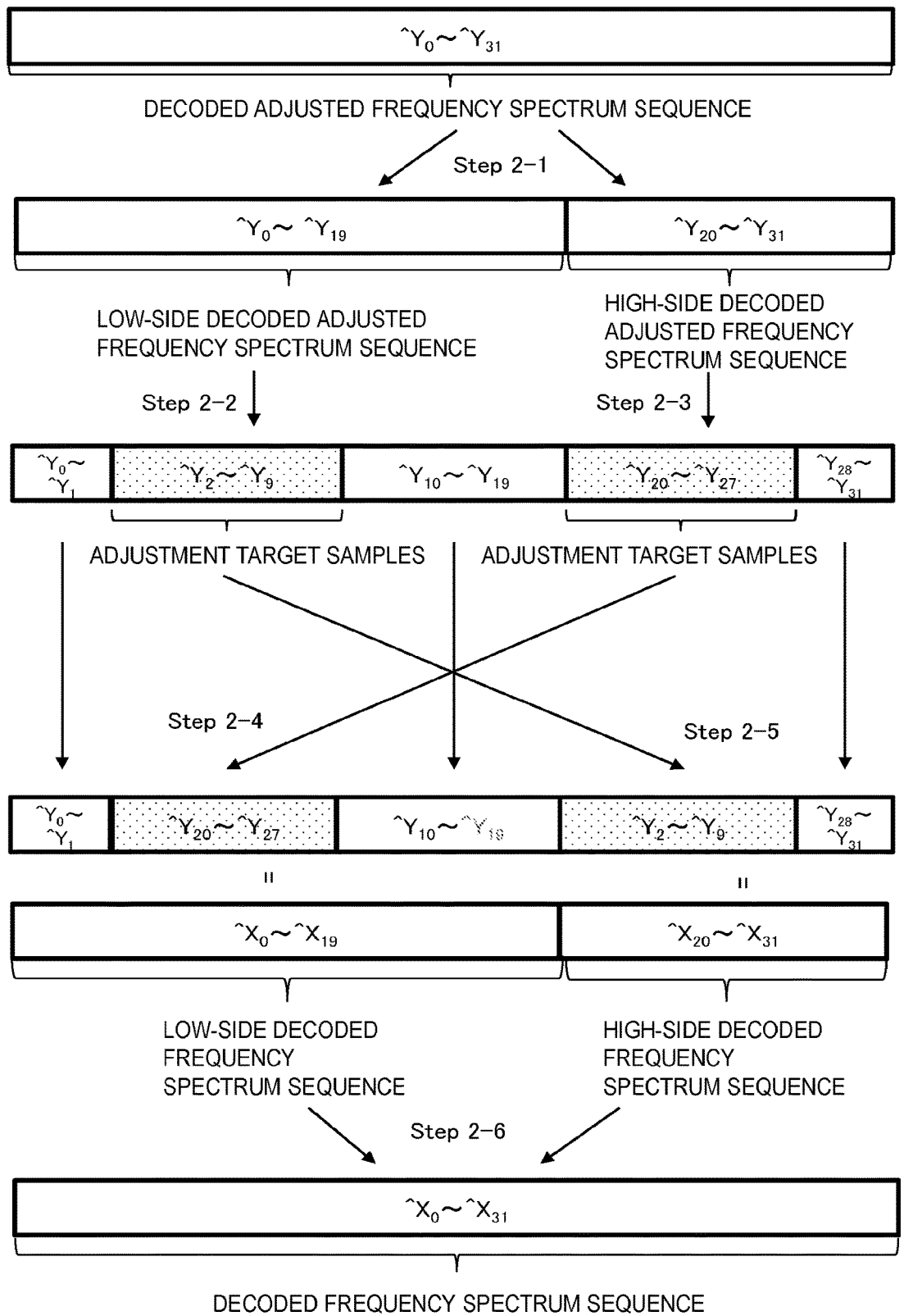
FIG. 7 is a diagram for illustrating an example of the fricative sound adjustment process.

An example of Steps 2-1 to 2-6 in the case of N=32, M=20 and C=8 is shown in FIG. 7. First, the fricative sound adjustment releasing part 23 sets $\hat{Y}_0, \ldots, \hat{Y}_{19}$ in a decoded adjusted frequency spectrum sequence $\hat{Y}_0, \ldots, \hat{Y}_{31}$ as a low-side decoded adjusted frequency spectrum sequence, and sets $\hat{Y}_{20}, \ldots, \hat{Y}_{31}$ as a high-side decoded adjusted frequency spectrum sequence (Step 2-1). The fricative sound adjustment releasing part 23 takes out eight samples $\hat{Y}_2, \ldots, \hat{Y}_9$ included in the low-side decoded adjusted frequency spectrum sequence $\hat{Y}_0, \ldots, \hat{Y}_{19}$ as samples targeted by adjustment to the high side (Step 2-2). The fricative sound adjustment releasing part 23 takes out eight samples $\hat{Y}_{20}, \ldots, \hat{Y}_{27}$ included in the high-side decoded adjusted frequency spectrum sequence $\hat{Y}_{20}, \ldots, \hat{Y}_{31}$ as samples targeted by adjustment to the low side (Step 2-3). The fricative sound adjustment releasing part 23 obtains what is obtained by arranging $\hat{Y}_{20}, \ldots, \hat{Y}_{27}$ at sample positions where $\hat{Y}_2, \ldots, \hat{Y}_9$ existed in the low-side decoded adjusted frequency spectrum sequence, as a low-side decoded frequency spectrum sequence $\hat{X}_0, \ldots, \hat{X}_{19}$ (Step 2-4). The fricative sound adjustment releasing part 23 obtains what is obtained by arranging $\hat{Y}_2, \ldots, \hat{Y}_9$ at sample positions where $\hat{Y}_{20}, \ldots, \hat{Y}_{27}$ existed in the high-side decoded adjusted frequency spectrum sequence, as a high-side decoded frequency spectrum sequence $\hat{X}_{20}, \ldots, \hat{X}_{31}$ (Step 2-5). The fricative sound adjustment releasing part 23 combines the low-side decoded frequency spectrum sequence $\hat{X}_0, \ldots, \hat{X}_{19}$ and the high-side decoded frequency spectrum sequence $\hat{X}_{20}, \ldots, \hat{X}_{31}$ to obtain a decoded frequency spectrum sequence $\hat{X}_0, \ldots, \hat{X}_{31}$ (Step 2-6).

[Example 2 of Adjustment Releasing Process Performed by Fricative Sound Adjustment Releasing Part 23]

If the fricative sound adjusting part 13 of the encoding apparatus performs Step 1-4' instead of Step 1-4, the fricative sound adjustment releasing part 23 performs Step 2-4' described below instead of Step 2-4 described above.

Step 2-4': What is obtained by moving remaining samples left after having taken out the samples targeted by adjustment to the high side in the low-side decoded adjusted frequency spectrum sequence at Step 2-2, to the low side and the high side, and arranging the samples targeted by adjustment to the low side, which were taken out from the high-side decoded adjusted frequency spectrum sequence at Step 2-3, at emptied sample positions in the middle is obtained as the low-side decoded frequency spectrum sequence $\hat{X}_0, \ldots, \hat{X}_{M-1}$.

[Example 3 of Adjustment Process Performed by Fricative Sound Adjusting Part 13]

If the fricative sound adjusting part 13 of the encoding apparatus performs Step 1-5' instead of Step 1-5, the fricative sound adjustment releasing part 23 performs Step 2-5' described below instead of Step 2-5 described above.

Step 2-5': What is obtained by moving remaining samples left after having taken out the samples targeted by adjustment to the low side in the high-side decoded adjusted frequency spectrum sequence at Step 2-3, to the high side, and arranging the samples targeted by adjustment to the high side, which were taken out from the low-side decoded adjusted frequency spectrum sequence at Step 2-2, at emptied sample positions on the low side is obtained as the high-side decoded frequency spectrum sequence $\hat{X}_M, \ldots, \hat{X}_{N-1}$.

Figure 8:
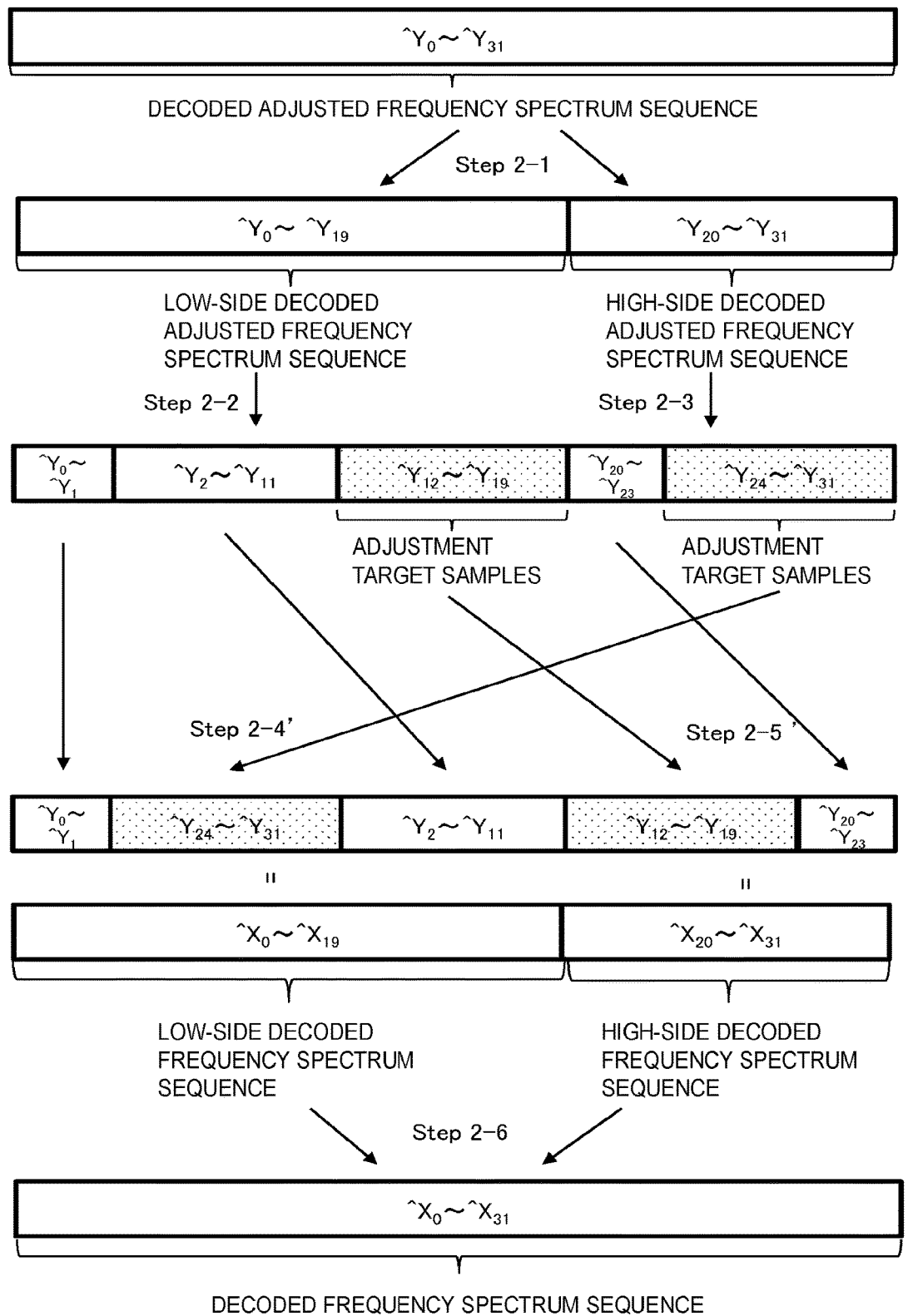
FIG. 8 is a diagram for illustrating an example of the fricative sound adjustment process.

FIG. 8 shows an example of performing Step 2-4' instead of Step 2-4 and Step 2-5' instead of Step 2-5 among Steps 2-1 to 2-6 in the case of N=32, M=20 and C=8. First, the fricative sound adjustment releasing part 23 sets $\hat{Y}_0, \ldots, \hat{Y}_{19}$ in the decoded adjusted frequency spectrum sequence $\hat{Y}_0, \ldots, \hat{Y}_{31}$ as a low-side decoded adjusted frequency spectrum sequence, and sets $\hat{Y}_{20}, \ldots, \hat{Y}_{31}$ as a high-side decoded adjusted frequency spectrum sequence (Step 2-1). The fricative sound adjustment releasing part 23 takes out eight samples $\hat{Y}_{12}, \ldots, \hat{Y}_{19}$ included in the low-side decoded adjusted frequency spectrum sequence $\hat{Y}_0, \ldots, \hat{Y}_{19}$ as samples targeted by adjustment to the high side (Step 2-2). The fricative sound adjustment releasing part 23 takes out eight samples $\hat{Y}_{24}, \ldots, \hat{Y}_{31}$ included in the high-side decoded adjusted frequency spectrum sequence $\hat{Y}_{20}, \ldots, \hat{Y}_{31}$ as samples targeted by adjustment to the low side (Step 2-3). The fricative sound adjustment releasing part 23 obtains what is obtained by moving $\hat{Y}_0, \hat{Y}_1$ in the low-side decoded adjusted frequency spectrum sequence to the low side, moving $\hat{Y}_2, \ldots, \hat{Y}_{11}$ to the high side, and arranging $\hat{Y}_{24}, \ldots, \hat{Y}_{31}$ at emptied positions, as the low-side decoded frequency spectrum sequence $\hat{X}_0, \ldots, \hat{X}_{19}$ (Step 2-4'). The fricative sound adjustment releasing part 23 moves $\hat{Y}_{20}, \ldots, \hat{Y}_{23}$ in the high-side decoded adjusted frequency spectrum sequence to the high side, and obtains what is obtained by arranging $\hat{Y}_{12}, \ldots, \hat{Y}_{19}$ on the low side of $\hat{Y}_{20}, \ldots, \hat{Y}_{23}$ moved to the high side, as a high-side decoded frequency spectrum sequence $\hat{X}_{20}, \ldots, \hat{X}_{31}$ (Step 2-5'). The fricative sound adjustment releasing part 23 combines the low-side decoded frequency spectrum sequence $\hat{X}_0, \ldots, \hat{X}_{19}$ and the high-side decoded frequency spectrum sequence $\hat{X}_{20}, \ldots, \hat{X}_{31}$ to obtain the decoded frequency spectrum sequence $\hat{X}_0, \ldots, \hat{X}_{31}$ (Step 2-6).

[Example 4 of Adjustment Releasing Process Performed by Fricative Sound Adjustment Releasing Part 23]

If the fricative sound adjusting part 13 of the encoding apparatus does not include one or more samples in ascending order of frequencies into the samples targeted by adjustment to the high side from the low-side frequency spectrum sequence at Step 1-2, the fricative sound adjustment releasing part 23 does not include the one or more samples in ascending order of frequencies into the samples targeted by adjustment to the high side from the low-side decoded adjusted frequency spectrum sequence at Step 2-2.

[Example 5 of Adjustment Releasing Process Performed by Fricative Sound Adjustment Releasing Part 23]

If the fricative sound adjusting part 13 of the encoding apparatus does not include one or more samples in descending order of frequencies into the samples targeted by adjustment to the low side from the high-side frequency spectrum sequence at Step 1-3, the fricative sound adjustment releasing part 23 does not include the one or more samples in descending order of frequencies into the samples targeted by adjustment to the low side from the high-side decoded adjusted frequency spectrum sequence at Step 2-3.

If the decoding part 22 and the fricative sound adjustment releasing part 23 are assumed to constitute a fricative sound compatible decoding part 26 as indicated by a dot-dash line in FIG. 3, it can be said that the fricative sound compatible decoding part 26 decodes a spectrum code to obtain a frequency spectrum sequence (a decoded frequency spectrum sequence) on the assumption that bits are preferentially assigned to the high side of the spectrum code if inputted information indicating whether a hissing sound or not indicates being a hissing sound, and, otherwise, the fricative sound compatible decoding part 26 decodes the spectrum code to obtain a frequency spectrum sequence (a decoded frequency spectrum sequence) on the assumption that the bits are preferentially assigned to the low side of the spectrum code.

[Time Domain Converting Part 24]

The decoded frequency spectrum sequence $\hat{X}_0, \ldots, \hat{X}_{N-1}$ outputted by the fricative sound adjustment releasing part 23 is inputted to the time domain converting part 24. For each frame, the time domain converting part 24 converts the decoded frequency spectrum sequence $\hat{X}_0, \ldots, \hat{X}_{N-1}$ to a time-domain signal using a method for conversion to a time domain corresponding to a method for conversion to a frequency domain performed by the frequency domain converting part 11 of the encoding apparatus, for example, inverse MDCT to obtain a sound signal (a decoded sound signal) for each frame, and outputs the sound signal (step S24).

If the frequency domain converting part 11 of the encoding apparatus performs filter processing and companding processing for the purpose of perceptual weighting, for the frequency spectrum sequence obtained by conversion, the time domain converting part 24 outputs a decoded sound signal obtained by converting what is obtained by performing inverse filter processing and inverse companding processing corresponding to the filter processing and the companding processing for the decoded frequency spectrum sequence, to a time-domain signal.

A configuration is also possible in which the decoding apparatus outputs not a time-domain decoded sound signal but a frequency-domain decoded sound signal. In the case of adopting this configuration, the decoding apparatus does not have to include the time domain converting part 24, and decoded frequency spectrum sequences in frames obtained by the fricative sound adjustment releasing part 23 can be coupled in order of time sections and outputted as a frequency-domain decoded sound signal.

<<Operation and Effects>>

According to the encoding apparatus and the decoding apparatus of the first embodiment, by making a configuration in which a fricative sound adjustment process and a fricative sound adjustment releasing process corresponding thereto are added to a conventional configuration in which an encoding process designed so that a larger number of bits are assigned to a low-frequency spectrum and a decoding process corresponding to the encoding process are performed, it becomes possible to perform compression encoding in a manner of reducing perceptual deterioration even for a sound signal including a fricative sound and the like.

As a conventional technique for performing compression encoding in a manner of reducing perceptual deterioration even for a sound signal including a fricative sound and the like, an encoding/decoding technique exists in which bits are preferentially assigned to high-energy subbands. In this technique, however, it is necessary to send bit assignment information about each subband from an encoding side to a decoding side. In comparison, according to the encoding apparatus and the decoding apparatus of the first embodiment, it becomes possible to, only by sending 1-bit fricative sound judgment information from an encoding side to a decoding side, perform compression encoding in a manner of reducing perceptual deterioration even for a sound signal including a fricative sound and the like.

<Modification of First Embodiment>

In a modification of the first embodiment, only the fricative sound judging part 12 included in the encoding apparatus is different from the first embodiment. The other components of the encoding apparatus and the components of the decoding apparatus are the same as the first embodiment. Hereinafter, an operation of the fricative sound judging part 12 different from the first embodiment, and operation and effects in the encoding apparatus and the decoding apparatus due to the operation will be described.

[Fricative Sound Judging Part 12]

The fricative sound judging part 12 of the modification of the first embodiment is provided with a comparison result storing part not shown.

For each frame, the fricative sound judging part 12 determines such an index that increases as a ratio of average energy of samples existing on a high side of an inputted frequency spectrum sequence $X_0, \ldots, X_{N-1}$ of the frame to average energy of samples existing on a low side of the inputted frequency spectrum sequence $X_0, \ldots, X_{N-1}$ is larger, as an index indicating that the frame is a hissing sound; and the fricative sound judging part 12 obtains comparison result information indicating whether the determined index is larger than a threshold determined in advance, or equal to or larger than the threshold.

The comparison result storing part stores pieces of such comparison result information corresponding to a predetermined number of past frames. In other words, for each frame, the fricative sound judging part 12 newly stores comparison result information calculated from a frequency spectrum sequence of the frame into the comparison result storing part and deletes the oldest comparison result information that has been stored.

Using the comparison result information calculated from the frequency spectrum sequence of the frame and the pieces of comparison result information about the predetermined number of past frames stored in the comparison result storing part, the fricative sound judging part 12 judges being a hissing sound if half or more of the pieces of comparison result information, or more than half of the pieces of comparison result information among these comparison result information indicate being larger than the predetermined threshold, or equal to or larger than the threshold and, otherwise, judges not being a hissing sound, and the fricative sound judging part 12 outputs the judgment result to the fricative sound adjusting part 13 and the multiplexing part 15 as a fricative sound judgment information.

In this way, if, among a plurality of frames including the frame, the number of frames, in which such an index that increases as a ratio of average energy of high-side frequency spectra in a frequency spectrum sequence of a sound signal to average energy of low-side frequency spectra increases is larger than a predetermined threshold, or equal to or larger than the threshold, is larger than the number of frames other than such frames, or equal to or larger than the number of frames other than such frames, the fricative sound judging part 12 may judge, for the frame, that the sound signal is a hissing sound.

It is the same as the fricative sound judging part 12 of the first embodiment that, for example, 1-bit information can be used as the fricative sound judgment information, that a mean value of a sum of absolute values or a mean value of a sum of squares of values of all or a part of samples can be used as average energy, and the like.

<<Operation and Effects>>

When the processes by the encoding apparatus and the decoding apparatus of the first embodiment are performed, a decoded sound with little encoding distortion of a high-side component and much encoding distortion of a low-side component is obtained for a frame for which the adjustment process and the adjustment releasing process are performed, and a decoded sound with much encoding distortion of a high-side component and little encoding distortion of a low-side component is obtained for a frame for which the adjustment process and the adjustment releasing process are not performed. Therefore, there is a possibility that discontinuity between waveforms of decoded sounds occurs at a boundary between the frame for which the adjustment process and the adjustment releasing process are performed and the frame for which the adjustment process and the adjustment releasing process are not performed. In other words, if the judgment result of the fricative sound judging part 12 frequently changes, the discontinuity between waveforms of decoded sounds frequently occurs, and there is a possibility that, by the discontinuity being felt, the perceptual quality deteriorates. The encoding apparatus of the modification of the first embodiment is more capable of restricting the judgment result of the fricative sound judging part 12 from frequently changing, suppressing occurrence frequency of discontinuity between waveforms of decoded sounds and suppressing deterioration of perceptual quality due to the discontinuity being felt than the encoding apparatus of the first embodiment.

In the fricative sound judging part 12 of the modification of the first embodiment, the more the number of pieces of comparison result information used for judgment is increased, the more it is possible to restrict the judgment result of the fricative sound judging part 12 from frequently changing and suppress occurrence frequency of discontinuity between waveforms of decoded sounds. However, it is necessary to determine the number of pieces of comparison result information used for judgment in consideration of tradeoff between deterioration of perceptual quality due to discontinuity being felt and perceptual quality of a decoded sound of each frame. For example, in the case of a frame length of 3 ms, it is recommended to set the number of pieces of comparison result information used for judgment to sixteen.

Second Embodiment

A system of a second embodiment of this invention includes an encoding apparatus and a decoding apparatus similar to the system of the first embodiment.

The second embodiment is different from the first embodiment in that frequency spectra to which bits are not assigned by the encoding apparatus are recovered by the decoding apparatus, that is, the bandwidth is extended by the decoding apparatus. The decoding apparatus of the second embodiment extends the bandwidth for a decoded adjusted frequency spectrum sequence, which is frequency spectra after exchange is performed based on fricative sound judgment information. Frequency spectra to which bits are not assigned by the encoding apparatus are included on a high side for a non-hissing sound time section and on a low side for a hissing sound time section. Therefore, in the second embodiment, as for the non-hissing sound time section, the bandwidth is extended by reproducing high-side frequency spectra by duplicating low-side frequency spectra, and, as for the hissing sound time section, the bandwidth is extended by reproducing low-side frequency spectra by duplicating high-side frequency spectra.

Duplication of frequency spectra in the second embodiment is performed by multiplying frequency spectra, which are a duplication source, by a gain. Therefore, in addition to what is performed by the encoding apparatus of the first embodiment, the encoding apparatus of the second embodiment determines the gain used by the decoding apparatus of the second embodiment and outputs a code corresponding to the determined gain.

<<Encoding Apparatus>>

Figure 9:
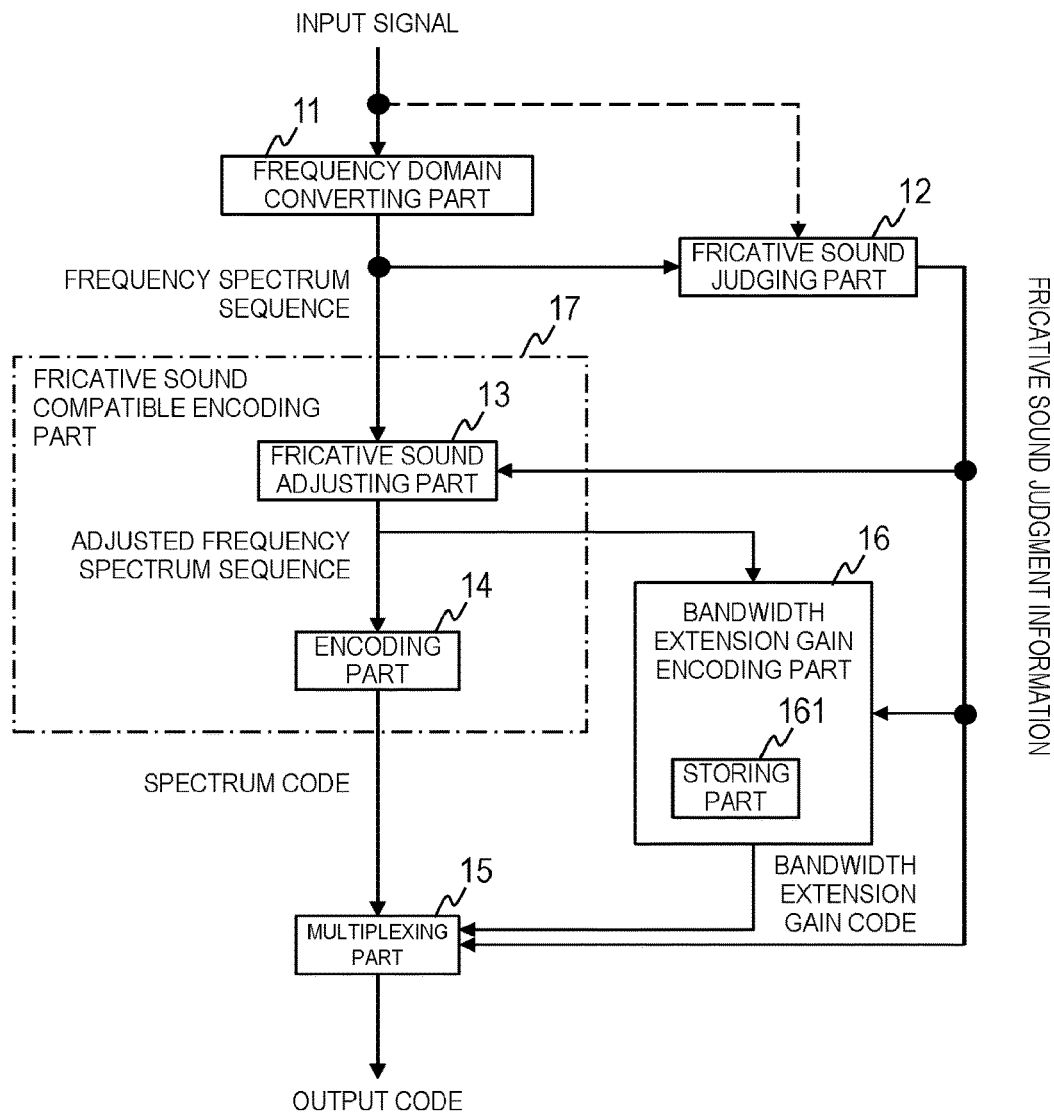
FIG. 9 is a block diagram showing an example of an encoding apparatus of a second embodiment.

A processing procedure of the encoding apparatus of the second embodiment will be described with reference to FIG. 9. As illustrated in FIG. 9, the encoding apparatus of the second embodiment includes the frequency domain converting part 11, the fricative sound judging part 12, the fricative sound adjusting part 13, the encoding part 14, a bandwidth extension gain encoding part 16 and the multiplexing part 15. The encoding apparatus of the second embodiment of FIG. 9 is different from the encoding apparatus of FIG. 1 in that the bandwidth extension gain encoding part 16 is provided and that the multiplexing part 15 also includes a bandwidth extension gain code outputted by the bandwidth extension gain encoding part 16 into a code to be outputted. Since operations of other components of the encoding apparatus of the second embodiment, that is, operations of the frequency domain converting part 11, the fricative sound judging part 12, the fricative sound adjusting part 13 and the encoding part 14 are the same as those of the encoding apparatus of the first embodiment, only main parts of the operations will be described below.

Figure 10:
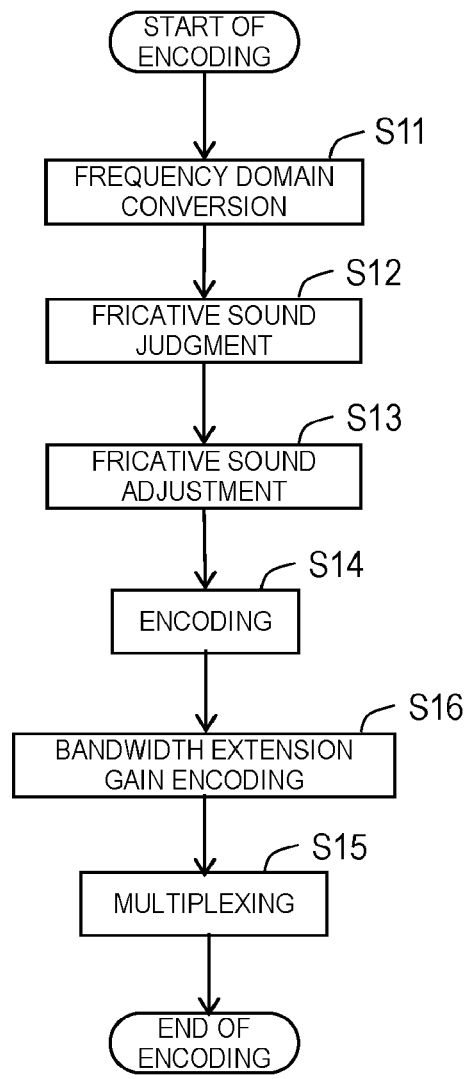
FIG. 10 is a flowchart showing an example of an encoding method of the second embodiment.

A time-domain sound signal is inputted to the encoding apparatus in each predetermined-time-length frame. The time-domain sound signal inputted to the encoding apparatus is inputted to the frequency domain converting part 11. The encoding apparatus performs processing for each predetermined-time-length frame by each part. An encoding method of the second embodiment is realized by the parts of the encoding apparatus performing processes from step S11 to step S16 described below and illustrated in FIG. 10.

[Frequency Domain Converting Part 11]

For each frame, the frequency domain converting part 11 converts the time-domain sound signal inputted to the encoding apparatus to a frequency spectrum sequence $X_0, \ldots, X_{N-1}$ at N points in a frequency domain and outputs the frequency spectrum sequence $X_0, \ldots, X_{N-1}$ (step S11).

[Fricative Sound Judging Part 12]

For each frame, the fricative sound judging part 12 judges whether the sound signal is a hissing sound or not using the frequency spectrum sequence $X_0, \ldots, X_{N-1}$ obtained by the frequency domain converting part 11 or the time-domain sound signal inputted to the encoding apparatus and outputs a result of the judgment as fricative sound judgment information (step S12). Though the fricative sound judging part 12 of the encoding apparatus of the first embodiment outputs the fricative sound judgment information to the fricative sound adjusting part 13 and the multiplexing part 15, the fricative sound judging part 12 of the encoding apparatus of the second embodiment also outputs the fricative sound judgment information to the bandwidth extension gain encoding part 16 in addition to the fricative sound adjusting part 13 and the multiplexing part 15. The fricative sound judging part 12 of the encoding apparatus of the second embodiment may perform the same operation as the fricative sound judging part 12 of the encoding apparatus of the modification of the first embodiment.

In other words, if such an index that increases as a ratio of average energy of high-side frequency spectra in a frequency spectrum sequence of a certain frame to average energy of low-side frequency spectra increases is larger than a predetermined threshold, or equal to or larger than the threshold, the fricative sound judging part 12 may judge that the sound signal is a hissing sound.

Further, if, among a plurality of frames including a certain frame, the number of frames, in which such an index that increases as a ratio of average energy of high-side frequency spectra in a frequency spectrum sequence to average energy of low-side frequency spectra increases is larger than a predetermined threshold, or equal to or larger than the threshold, is larger than the number of frames other than such frames, or equal to or larger than the number of frames other than such frames, the fricative sound judging part 12 may judge that the sound signal is a hissing sound.

[Fricative Sound Adjusting Part 13]

For each frame, if the fricative sound judgment information obtained by the fricative sound judging part 12 indicates being a hissing sound, the fricative sound adjusting part 13 performs a frequency spectrum adjustment process for the frequency spectrum sequence $X_0, \ldots, X_{N-1}$ obtained by the frequency domain converting part 11 to obtain an adjusted frequency spectrum sequence $Y_0, \ldots, Y_{N-1}$, and outputs the obtained adjusted frequency spectrum sequence $Y_0, \ldots, Y_{N-1}$ to the encoding part 14; and, if the fricative sound judgment information obtained by the fricative sound judging part 12 indicates not being a hissing sound, the fricative sound adjusting part 13 immediately outputs the frequency spectrum sequence $X_0, \ldots, X_{N-1}$ obtained by the frequency domain converting part 11 to the encoding part 14 as it is, as the adjusted frequency spectrum sequence $Y_0, \ldots, Y_{N-1}$ (step S13).

The frequency spectrum sequence adjustment process that the fricative sound adjusting part 13 performs is a process for obtaining what is obtained by exchanging all or a part of samples of a low-side frequency spectrum sequence $X_0, \ldots, X_{M-1}$ in the frequency spectrum sequence $X_0, \ldots, X_{N-1}$ for all or a part of samples of a high-side frequency spectrum sequence $X_M, \ldots, X_{N-1}$ in the frequency spectrum sequence $X_0, \ldots, X_{N-1}$ as the adjusted frequency spectrum sequence $Y_0, \ldots, Y_{N-1}$, the number of all or the part of the samples of the high-side frequency spectrum sequence $X_M, \ldots, X_{N-1}$ being the same as the number of all or the part of the samples of the low-side frequency spectrum sequence $X_0, \ldots, X_{M-1}$.

In other words, if the fricative sound judging part 12 judges being a hissing sound, the fricative sound adjusting part 13 obtains what is obtained by exchanging all or a part of a low-side frequency spectrum sequence existing on a lower side than a predetermined frequency in a frequency spectrum sequence of a sound signal for all or a part of a high-side frequency spectrum sequence existing on a higher side of the predetermined frequency in the frequency spectrum sequence as an adjusted frequency spectrum sequence, the number of all or the part of the high-side frequency spectrum sequence being the same as the number of all or the part of the low-side frequency spectrum sequence; and, otherwise, the fricative sound adjusting part 13 immediately obtains the frequency spectrum sequence corresponding to the sound signal as it is, as the adjusted frequency spectrum sequence.

[Encoding Part 14]

For each frame, the encoding part 14 encodes the adjusted frequency spectrum sequence $Y_0, \ldots, Y_{N-1}$ obtained by the fricative sound adjusting part 13 in a method in which bits are preferentially assigned to samples with small sample numbers to obtain a spectrum code, and outputs the obtained spectrum code to the multiplexing part 15 (step S14).

The method for preferentially assigning bits to samples with smaller sample numbers by the encoding part 14 of the encoding apparatus of the first embodiment may be a method in which bits are assigned to all samples of an adjusted frequency spectrum sequence or a method in which bits are not assigned to a part of samples with larger sample numbers. In comparison, a method for preferentially assigning bits to samples with smaller sample numbers by the encoding part 14 of the encoding apparatus of the second embodiment is assumed to be limited to a method in which bits are not assigned to a part of adjusted frequency spectra with larger sample numbers in the adjusted frequency spectrum sequence. This bit assignment method is determined in advance and stored in the encoding part 14, and is also stored in the bandwidth extension gain encoding part 16 to be described later.

For example, the encoding part 14 does not assign bits to K (K≤N/2) adjusted frequency spectra $Y_{N-K}, \ldots, Y_{N-1}$ with larger sample numbers among N adjusted frequency spectra of an adjusted frequency spectrum sequence $Y_0, \ldots, Y_{N-1}$, assigns bits to N-K adjusted frequency spectra $Y_0, \ldots, Y_{N-K-1}$ in ascending order of sample numbers among remaining adjusted frequency spectra, encodes the adjusted frequency spectrum sequence $Y_0, \ldots, Y_{N-1}$ to obtain a spectrum code, and outputs the obtained spectrum code to the multiplexing part 15. In other words, substantially, the encoding part 14 encodes only the N-K adjusted frequency spectra $Y_0, \ldots, Y_{N-K-1}$ in ascending order of sample numbers among the N adjusted frequency spectra of the adjusted frequency spectrum sequence $Y_0, \ldots, Y_{N-1}$ to obtain a spectrum code.

[Bandwidth Extension Gain Encoding Part 16]

At least the adjusted frequency spectrum sequence $Y_0, \ldots, Y_{N-1}$ outputted by the fricative sound adjusting part 13 is inputted to the bandwidth extension gain encoding part 16. For each frame, the bandwidth extension gain encoding part 16 obtains a bandwidth extension gain code as below at least based on the inputted adjusted frequency spectrum sequence $Y_0, \ldots, Y_{N-1}$ and outputs the obtained bandwidth extension gain code to the multiplexing part 15 (step S16).

In the case of adopting a configuration in which only the adjusted frequency spectrum sequence $Y_0, \ldots, Y_{N-1}$ is inputted to the bandwidth extension gain encoding part 16, the bandwidth extension gain encoding part 16 obtains a bandwidth extension gain code based on the inputted adjusted frequency spectrum sequence $Y_0, \ldots, Y_{N-1}$ for each frame, and outputs the obtained bandwidth extension gain code to the multiplexing part 15, for example, as in an example 1 below.

A configuration is also possible in which, in addition to the adjusted frequency spectrum sequence $Y_0, \ldots, Y_{N-1}$, the fricative sound judgment information outputted by the fricative sound judging part 12 is also inputted to the bandwidth extension gain encoding part 16. In the case of adopting this configuration, the bandwidth extension gain encoding part 16 obtains a bandwidth extension gain code based on the inputted adjusted frequency spectrum sequence $Y_0, \ldots,$ $Y_{N-1}$ and the fricative sound judgment information for each frame, and outputs the obtained bandwidth extension gain code to the multiplexing part 15, for example, as in an example 2 below.

In a storing part 161 of the bandwidth extension gain encoding part 16, a plurality of pairs of a gain candidate vector, which is a candidate for a gain vector, and a code capable of identifying the gain candidate vector are stored in advance. Each gain candidate vector is configured with gain candidate values corresponding to a plurality of samples. For each frame, the bandwidth extension gain encoding part 16 obtains a code corresponding to such a gain candidate vector that a sum total of absolute values of differences between absolute values of values obtained by multiplying values of adjusted frequency spectra to which bits have not been assigned by the encoding part 14 by gain candidate values constituting the gain candidate vector and absolute values of values of adjusted frequency spectra to which bits have not been assigned by the encoding part 14 is minimized, as a bandwidth extension gain code, and outputs the bandwidth extension gain code. Instead of absolute values, squared values or the like may be used.

Hereinafter, description will be made on an example of a case where the adjusted frequency spectra to which bits have been assigned by the encoding part 14 are the N-K adjusted frequency spectra $Y_0, \ldots, Y_{N-K-1}$ in ascending order of sample numbers in the adjusted frequency spectrum sequence $Y_0, \ldots, Y_{N-1}$, and the adjusted frequency spectra to which bits have not been assigned by the encoding part 14 are the K adjusted frequency spectra $Y_{N-K}, \ldots, Y_{N-1}$ in descending order of sample numbers in the adjusted frequency spectrum sequence $Y_0, \ldots, Y_{N-1}$.

[Example 1 of Bandwidth Extension Gain Encoding Part 16]

In this example, it is assumed that J pairs of a gain candidate vector and a code are stored in the storing part 161, and each gain candidate vector is configured with gain candidate values corresponding to K samples. Hereinafter, description will be made on the assumption that the J gain candidate vectors are indicated by $G_j$ (j=0, ..., J-1), respectively, codes corresponding to the gain candidate vectors $G_j$ (j=0, ..., J-1), respectively, are indicated by $C_{Gj}$ (j=0, ..., J-1), and each of the gain candidate vectors $G_j$ is configured with K gain candidate values $g_{j,k}$ (k=0, ..., K-1).

The bandwidth extension gain encoding part 16 outputs a code $C_{Gj}$ corresponding to such a gain candidate vector $G_j$ that $E_j$ determined by Formula (1) below is the smallest, among the gain candidate vectors $G_j$ (j=0, ..., J-1) stored in the storing part 161, as a bandwidth extension gain code $C_G$.

[Formula 1]

$$E_j = \sum_{k=0}^{K-1} ||Y_{N-2K+k} g_{j,k}| - |Y_{N-K+k}|| \quad (1)$$

In other words, the bandwidth extension gain encoding part 16 obtains and outputs a code corresponding to such a gain candidate vector that a sum total $E_j$ of absolute values $||Y_{N-2K} g_{j,0}|-|Y_{N-K}||, \ldots, ||Y_{N-K-1} g_{j,K}|-|Y_{N-1}||$ of differences between absolute values $|Y_{N-2K} g_{j,0}|, \ldots, |Y_{N-K-1} g_{j,K}|$ of values obtained by multiplying K adjusted frequency spectra $Y_{N-2K}, \ldots, Y_{N-K-1}$ in descending order of sample numbers, among the adjusted frequency spectra $Y_0, \ldots, Y_{N-K-1}$ to which bits have been assigned by the encoding part 14, by gain candidate values $g_{j,0}, \ldots, g_{j,K-1}$ constituting the gain candidate vectors, respectively, and respective absolute values $|Y_{N-K}|, \ldots, |Y_{N-1}|$ of the adjusted frequency spectra $Y_{N-K}, \ldots, Y_{N-1}$ to which bits have not been assigned by the encoding part 14 is the smallest, as a bandwidth extension gain code.

[Example 2 of Bandwidth Extension Gain Encoding Part 16]

In this example, it is assumed that, though J pairs of a gain candidate vector and a code are stored in the storing part 161 similarly to the example 1, two kinds, fricative sound gain candidate vectors and non-fricative sound gain candidate vectors, are stored as the gain candidate vectors unlike the example 1. In other words, it is assumed that J sets of a fricative sound gain candidate vector, a non-fricative sound gain candidate vector and a code are stored in the storing part 161, and each of the fricative sound gain candidate vectors and the non-fricative sound gain candidate vectors is configured with gain candidate values corresponding to K samples. Hereinafter, description will be made on the assumption that the J fricative sound gain candidate vectors are respectively indicated by $G1_j$ (j=0, ..., J−1), the J non-fricative sound gain candidate vectors are respectively indicated by $G2_j$ (j=0, ..., J−1), and codes corresponding to the fricative sound gain candidate vectors $G1_j$ (j=0, ..., J−1), respectively, and corresponding to the non-fricative sound gain candidate vectors $G2_j$ (j=0, ..., J−1), respectively, are indicated by $C_{Gj}$ (j=0, ..., J−1). Further, the description will be made on the assumption that each of the fricative sound gain candidate vectors $G1_j$ is configured with gain candidate values corresponding to K samples, that is, K gain candidate values $g1_{j,k}$ (k=0, ..., K−1), and each of the non-fricative sound gain candidate vectors $G2_j$ is configured with gain candidate values corresponding to K samples, that is, K gain candidate values $g2_{j,k}$ (k=0, ..., K−1).

The bandwidth extension gain encoding part 16 outputs a bandwidth extension gain code $C_{Gj}$ corresponding to such a gain candidate vector $G_j$ that $E_j$ determined by the above formula (1) is the smallest, among the gain candidate vectors $G_j$ (j=0, ..., J−1), as the bandwidth extension gain code $C_G$, with the fricative sound gain candidate vectors $G1_j$ (j=0, ..., J−1) stored in the storing part 161 used as the gain candidate vectors $G_j$ (j=0, ..., J−1) if the inputted fricative sound judgment information indicates being a hissing sound, and with the non-fricative sound gain candidate vectors $G2_j$ (j=0, ..., J−1) stored in the storing part 161 used as the gain candidate vectors $G_j$ (j=0, ..., J−1) if the inputted fricative sound judgment information indicates not being a hissing sound.

In other words, with the fricative sound gain candidate vectors stored in the storing part 161 as the gain candidate vectors if the inputted fricative sound judgment information indicates being a hissing sound, and with the non-fricative sound gain candidate vectors stored in the storing part 161 used as the gain candidate vectors if the inputted fricative sound judgment information indicates not being a hissing sound, the bandwidth extension gain encoding part 16 obtains and outputs a code corresponding to such a gain candidate vector that a sum total $E_j$ of absolute values $\||Y_{N-2K} g_{j,0}|-|Y_{N-K}|\|, \ldots, \||Y_{N-K-1} g_{j,K-1}|-|Y_{N-1}|\|$ of differences between absolute values $|Y_{N-2K} g_{j,0}|, \ldots, |Y_{N-K-1} g_{j,K-1}|$ of values obtained by multiplying the K adjusted frequency spectra $Y_{N-2K}, \ldots, Y_{N-K-1}$ in descending order of sample numbers, among the adjusted frequency spectra $Y_0, \ldots, Y_{N-K-1}$ to which bits have been assigned by the encoding part 14 by the gain candidate values $g_{j,0}, \ldots, g_{j,K-1}$ constituting the gain candidate vectors, respectively, and the respective absolute values $|Y_{N-K}|, \ldots, |Y_{N-1}|$ of the adjusted frequency spectra $Y_{N-K}, \ldots, Y_{N-1}$ to which bits have not been assigned by the encoding part 14 is the smallest, as a bandwidth extension gain code.

Thus, a plurality of codes, fricative sound gain candidate vectors corresponding to the codes, respectively, and non-fricative sound gain candidate vectors corresponding to the codes, respectively, are stored in the bandwidth extension gain encoding part 16, and the bandwidth extension gain encoding part 16 may use the fricative sound gain candidate vectors as the gain candidate vectors if the fricative sound judging part judges being a hissing sound and, otherwise, use the non-fricative sound gain candidate vectors as the gain candidate vectors.

[Modification 1 of Examples 1 and 2 of Bandwidth Extension Gain Encoding Part 16]

In the examples 1 and 2 described above, adjusted frequency spectra targeted by multiplication of gain candidate values are the K adjusted frequency spectra $Y_{N-2K}, \ldots, Y_{N-K-1}$ in descending order of sample numbers among the adjusted frequency spectra $Y_0, \ldots, Y_{N-K-1}$ to which bits have been assigned by the encoding part 14. However, the adjusted frequency spectra targeted by multiplication of gain candidate values are only required to be K adjusted frequency spectra corresponding to K sample numbers determined in advance among the adjusted frequency spectra $Y_0, \ldots, Y_{N-K-1}$ to which bits have been assigned by the encoding part 14.

[Modification 2 of Examples 1 and 2 of Bandwidth Extension Gain Encoding Part 16]

In the examples 1 and 2 described above, $Y_{N-2K+k}$, $g_{j,k}$ and $Y_{N-K+k}$ in ascending order of values of k are associated in the formula (1). However, any association is possible if the association is determined in advance.

[Specific Example of Bandwidth Extension Gain Encoding Part 16]

Figure 13:
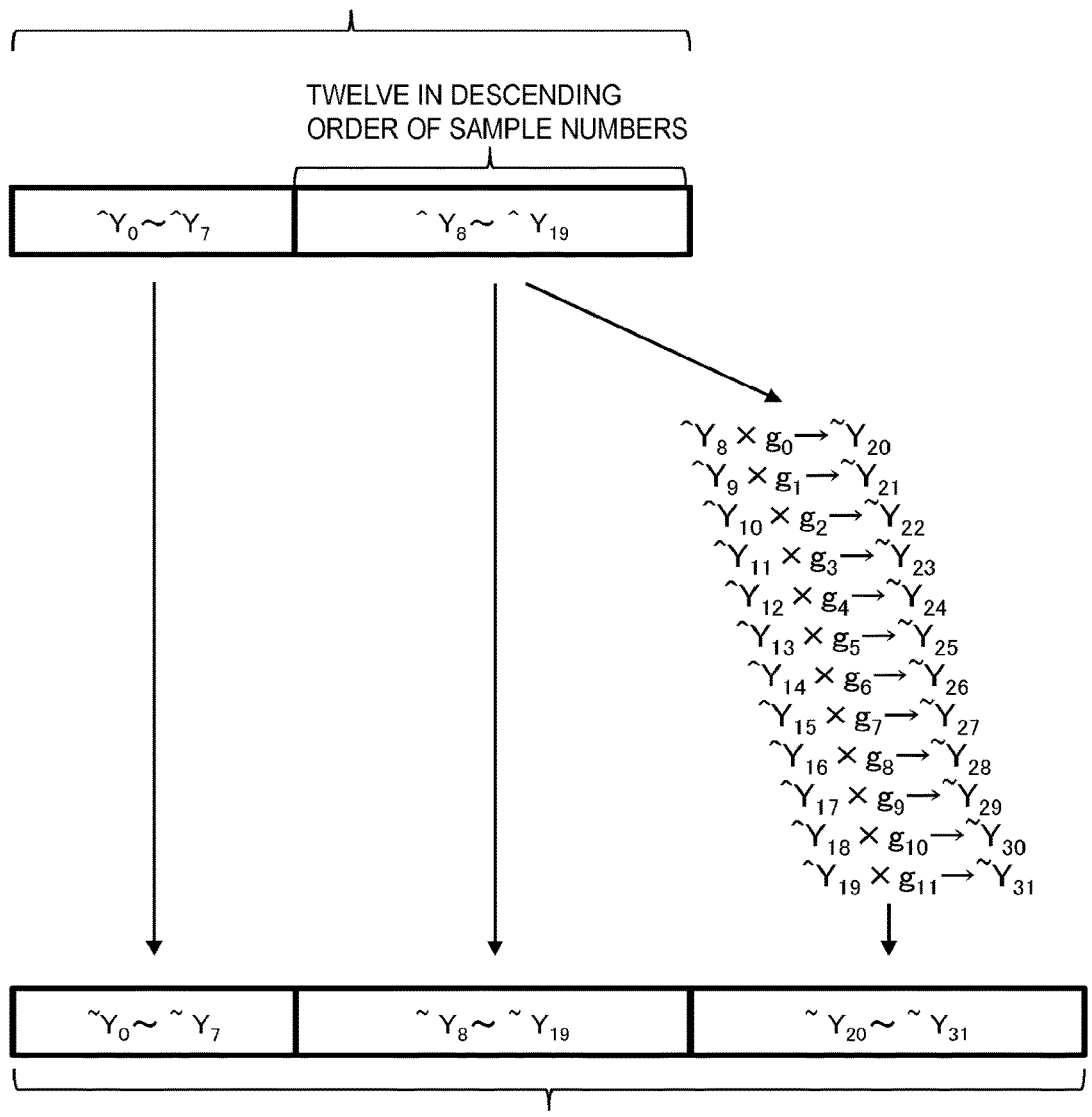
FIG. 13 is a diagram for illustrating an example of a bandwidth extension process and a fricative sound adjustment releasing process.
Figure 14:
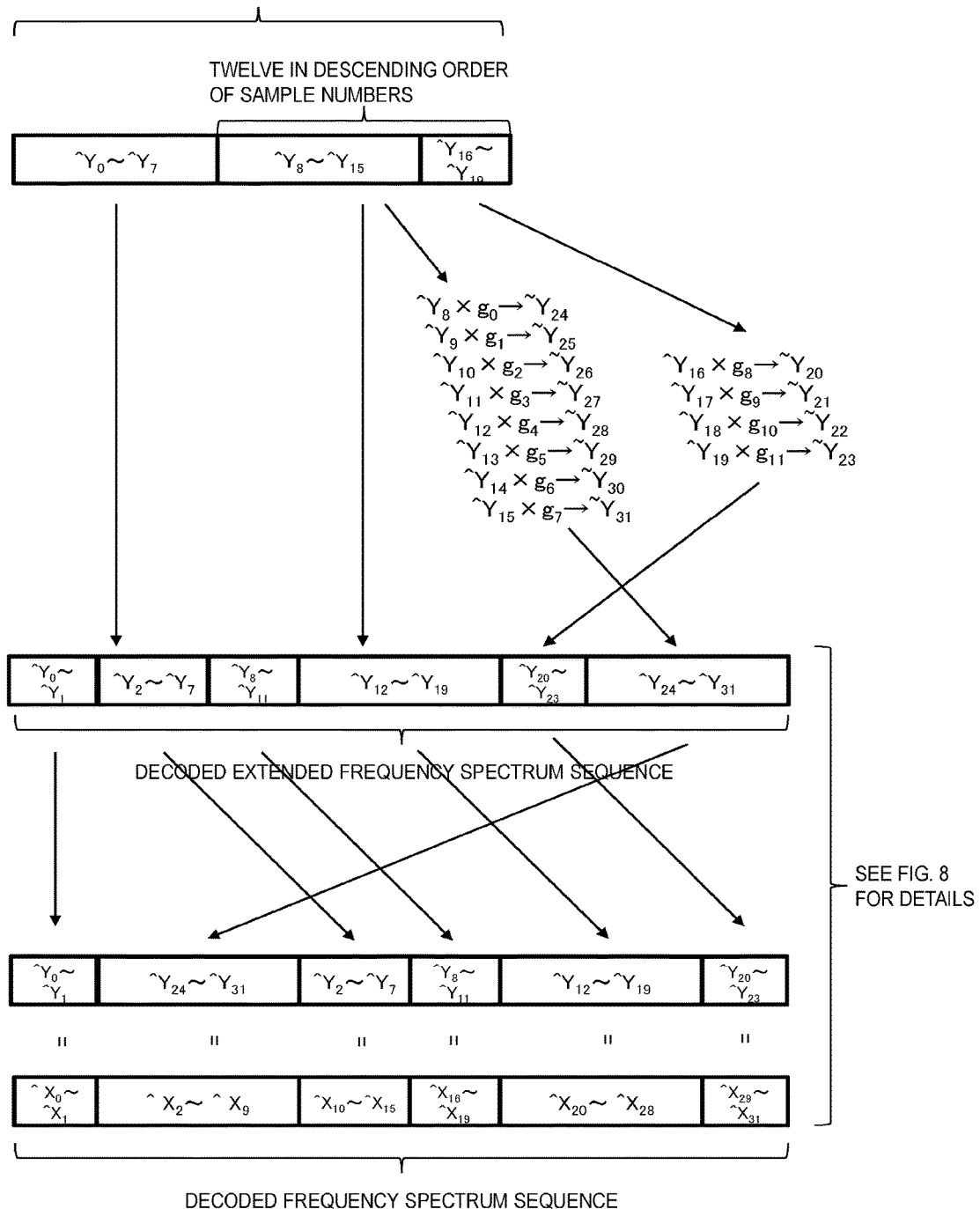
FIG. 14 is a diagram for illustrating an example of the bandwidth extension process and the fricative sound adjustment releasing process.
Figure 15:
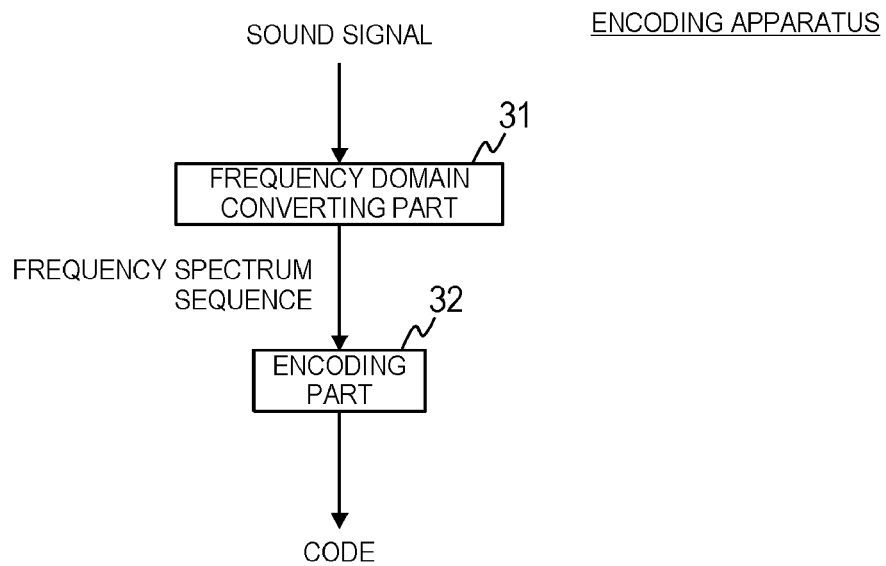
FIG. 15 is a block diagram showing an example of an encoding apparatus of a conventional technique.
Figure 16:
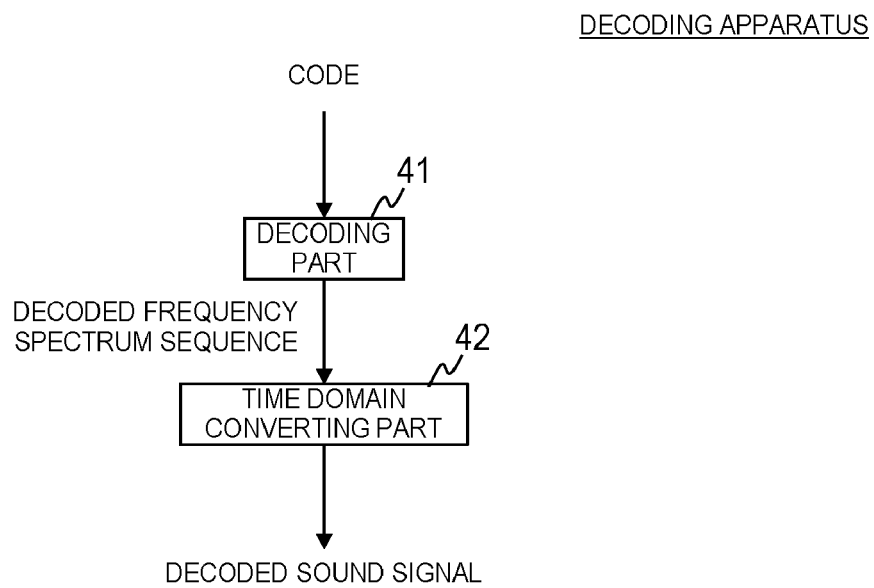
FIG. 16 is a block diagram showing an example of a decoding apparatus of the conventional technique.

A specific example of the bandwidth extension gain encoding part 16 in the case of N=32 and K=12 will be described. This specific example corresponds to a modification example 2 of the example 2 of the bandwidth extension gain encoding part 16. FIGS. 13 and 14 show examples of a bandwidth extending part 25 and the fricative sound adjustment releasing part 23 of the decoding apparatus to be described later in the case of N=32 and K=12.

FIG. 13 shows an example of a case where the fricative sound judgment information indicates not being a hissing sound. As described later, the bandwidth extending part 25 performs a process for, with the 8th to 19th decoded adjusted frequency spectra used as duplication sources, obtaining values obtained by multiplying values of the duplication-source decoded adjusted frequency spectra and bandwidth extension gains, as the 20th to 31st decoded extended frequency spectra in order of sample numbers. Here, with the non-fricative sound gain candidate vectors stored in the storing part 161 used as the gain candidate vectors if the inputted fricative sound judgment information indicates not being a hissing sound, the bandwidth extension gain encoding part 16 obtains a code corresponding to such a gain candidate vector that a sum total $E_j$ of absolute values $\||Y_8 g_{j,0}|-|Y_{20}|\|, \ldots, \||Y_{19} g_{j,11}|-|Y_{31}|\|$ of differences between absolute values $|Y_8 g_{j,0}|, \ldots, |Y_{19} g_{j,11}|$ of values obtained by multiplying twelve adjusted frequency spectra $Y_8, \ldots, Y_{19}$ in descending order of sample numbers, among adjusted frequency spectra $Y_0, \ldots, Y_{19}$ to which bits have been assigned by the encoding part 14 by gain candidate values $g_{j,0}, \ldots, g_{j,11}$ constituting the gain candidate vector, respectively, and respective absolute values $|Y_{20}|, \ldots, |Y_{31}|$ of adjusted frequency spectra $Y_{20}, \ldots, Y_{31}$ to which bits have not been assigned by the encoding part 14 is the smallest, as a bandwidth extension gain code.

FIG. 14 shows an example of a case where the fricative sound judgment information indicates being a hissing sound. As described later, the bandwidth extending part 25 of the decoding apparatus performs a process for, with the 8th to 19th decoded adjusted frequency spectra used as duplication sources, obtaining what is obtained by arranging values obtained by multiplying the duplication-source decoded adjusted frequency spectra value by bandwidth extension gains in such order that the 8th to 15th sample numbers are after the 16th to 19th sample numbers, as the 20th to 31st decoded extended frequency spectra. Here, with the fricative sound gain candidate vectors stored in the storing part 161 used as the gain candidate vectors if the inputted fricative sound judgment information indicates being a hissing sound, the bandwidth extension gain encoding part 16 obtains a code corresponding to such a gain candidate vector that a sum total $E_j$ of absolute values $\|Y_8\ g_{j,0}|-|Y_{24}\|, \ldots, \|Y_{15}\ g_{j,7}|-|Y_{31}\|, \|Y_{16}\ g_{j,8}|-|Y_{20}\|, \ldots, \|Y_{19}\ g_{j,11}|-|Y_{23}\|$ of differences between absolute values $|Y_8\ g_{j,0}|, \ldots, |Y_{19}\ g_{j,11}|$ of values obtained by multiplying the twelve adjusted frequency spectra $Y_8, \ldots, Y_{19}$ in descending order of sample numbers among the adjusted frequency spectra $Y_0, \ldots, Y_{19}$ to which bits have been assigned by the encoding part 14 by the gain candidate values $g_{j,0}, \ldots, g_{j,11}$ constituting the gain candidate vector, respectively, and respective absolute values $|Y_{24}|, \ldots, |Y_{31}|, |Y_{20}|, \ldots, |Y_{23}|$ of adjusted frequency spectra $Y_{24}, \ldots, Y_{31}, Y_{20}, \ldots, Y_{23}$ to which bits have not been assigned by the encoding part 14 is the smallest, as a bandwidth extension gain code.

Thus, a plurality of codes and gain candidate vectors corresponding to the codes, respectively, are stored in the bandwidth extension gain encoding part 16; and, on the assumption that each of the gain candidate vectors includes K gain candidate values (K is an integer equal to or larger than 2), the bandwidth extension gain encoding part 16 obtains and outputs a code corresponding to such a gain candidate vector that an error between a sequence by absolute values of K values obtained by multiplying K adjusted frequency spectra to which bits have been assigned by the encoding part 14 in an adjusted frequency spectrum sequence by K gain candidate vector values included in a gain candidate vector and a sequence by absolute values of K adjusted frequency spectra to which bits have not been assigned by the encoding part 14 in the adjusted frequency spectrum sequence is the smallest, as a bandwidth extension gain code.

This operation of the bandwidth extension gain encoding part 16 is associated with the operations of the bandwidth extending part 25 and the fricative sound adjustment releasing part 23 of the decoding apparatus. In the example of FIG. 8, the fricative sound adjustment releasing part 23 of the decoding apparatus causes the 20th to 23rd decoded extended frequency spectra on the side with small sample numbers, among the 20th to 31st decoded extended frequency spectra, to be decoded frequency spectra with the 28th to 31st sample numbers, and causes the 24th to 31st decoded extended frequency spectra on the side with large sample numbers, among the 20th to 31st decoded extended frequency spectra, to be decoded frequency spectra with the 2nd to 9th sample numbers. The bandwidth extending part 25 of the decoding apparatus performs the operation in FIG. 14 in consideration of levels of frequencies of the decoded frequency spectra obtained by this operation of the fricative sound adjustment releasing part 23.

In other words, the bandwidth extending part 25 of the decoding apparatus is adapted to perform a process that matches the levels of frequencies of decoded frequency spectra no matter whether the fricative sound judgment information indicates being a hissing sound or indicates not being a hissing sound. Therefore, the bandwidth extension gain encoding part 16 also performs an operation corresponding to the bandwidth extending part 25.

[Multiplexing Part 15]

The fricative sound judgment information outputted by the fricative sound judging part 12, the spectrum code outputted by the encoding part 14 and the bandwidth extension gain code outputted by the bandwidth extension gain encoding part 16 are inputted to the multiplexing part 15. The multiplexing part 15 outputs a code obtained by combining a code corresponding to the inputted fricative sound judgment information, the spectrum code and the bandwidth extension gain code (step S15).

<<Decoding Apparatus>>

Figure 11:
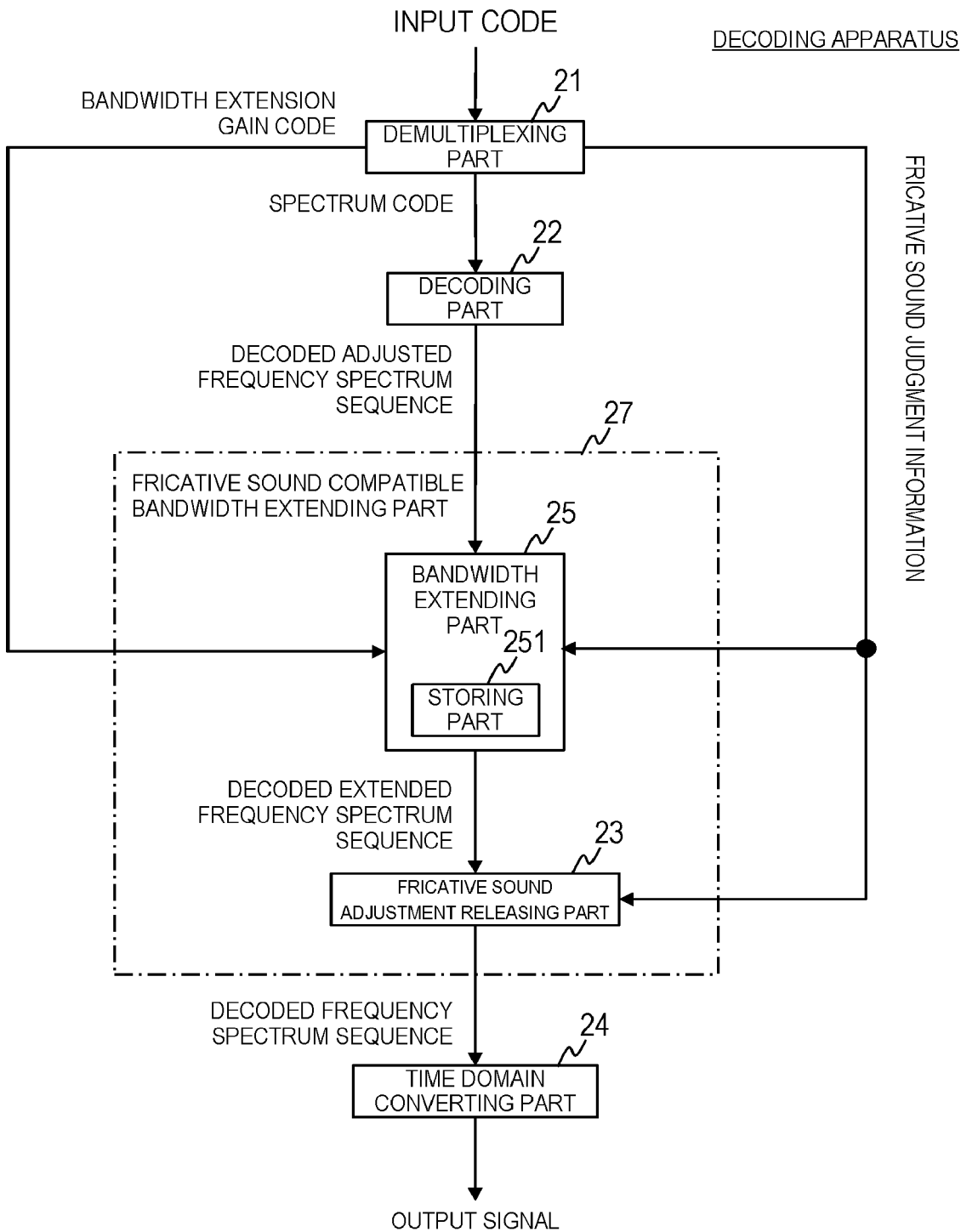
FIG. 11 is a block diagram showing an example of a decoding apparatus of the second embodiment.

A processing procedure of the decoding apparatus of the second embodiment will be described with reference to FIG. 11. As illustrated in FIG. 11, the decoding apparatus of the second embodiment includes the demultiplexing part 21, the decoding part 22, the bandwidth extending part 25, the fricative sound adjustment releasing part 23 and the time domain converting part 24. The decoding apparatus of the second embodiment in FIG. 11 is different from the decoding apparatus of the first embodiment in FIG. 3 in that the bandwidth extending part 25 is provided and that the demultiplexing part 21 also obtains a bandwidth extension gain code from an inputted code. Since operations of other components of the decoding apparatus of the second embodiment, that is, operations of the decoding part 22, the fricative sound adjustment releasing part 23 and the time domain converting part 24 are the same as those of the decoding apparatus of the first embodiment, only main parts of the operations will be described below.

Figure 12:
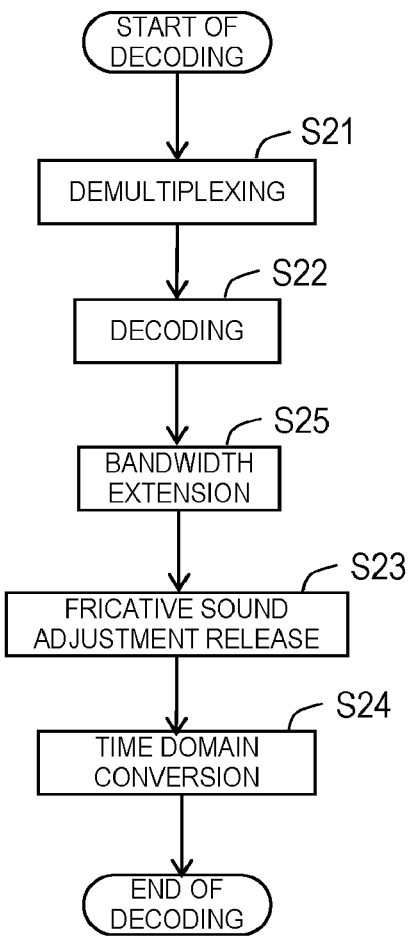
FIG. 12 is a flowchart showing an example of a decoding method of the second embodiment.

A code outputted by the encoding apparatus is inputted to the decoding apparatus. The code inputted to the decoding apparatus is inputted to the demultiplexing part 21. The decoding apparatus performs processing for each predetermined-time-length frame by each part. A decoding method of the second embodiment is realized by the parts of the decoding apparatus performing a process from step S21 to step S25 described below and illustrated in FIG. 12.

[Demultiplexing Part 21]

The demultiplexing part 21 separates the inputted code into a code corresponding to fricative sound judgment information, a bandwidth extension gain code and a spectrum code, and outputs fricative sound judgment information obtained from the code corresponding to the fricative sound judgment information to the fricative sound adjustment releasing part 23 and the bandwidth extending part 25, the bandwidth extension gain code to the bandwidth extending part 25, and the spectrum code to the decoding part 22 (step S21).

[Decoding Part 22]

For each frame, the decoding part 22 decodes the inputted spectrum code by a decoding process corresponding to an encoding process performed by the encoding part 14 of the encoding apparatus to obtain and output a decoded adjusted frequency spectrum sequence (step S22).

Since the encoding part 14 of the encoding apparatus of the second embodiment performs the encoding process in which bits are not assigned to a part of samples with larger sample numbers as described above, values of decoded adjusted frequency spectra of these sample numbers are not obtained even if a spectrum code is decoded. In the case of the example of the encoding part 14 described above, the decoding part 22 decodes a spectrum code to obtain a decoded adjusted frequency spectrum sequence by N-K decoded adjusted frequency spectra $\hat{Y}_0, \ldots, \hat{Y}_{N-K-1}$ in ascending order of sample numbers.

The values of decoded adjusted frequency spectra of sample numbers to which bits have not been assigned by the encoding part 14 may be 0's. In other words, in the case of the example of the encoding part 14 described above, the decoding part 22 may decode a spectrum code to obtain a decoded adjusted frequency spectrum sequence $\hat{Y}_0, \ldots, \hat{Y}_{N-1}$, with the value of each of K decoded adjusted frequency spectra $\hat{Y}_{N-K}, \ldots, \hat{Y}_{N-1}$ in descending order of sample numbers as 0.

In this way, by decoding a spectrum code which is a spectrum code for each frame in a predetermined time section and in which bits are not assigned to a part on the high side, the decoding part 22 obtains a frequency-domain sample sequence (a decoded adjusted frequency spectrum sequence).

However, as described later, if inputted information indicating whether being a hissing sound or not indicates being a hissing sound, the fricative sound adjustment releasing part 23 obtains what is obtained by exchanging all or a part of a low-side frequency sample sequence existing on a lower side than a predetermined frequency in a decoded extended frequency spectrum sequence obtained by the bandwidth extending part 25 (a spectrum sequence based on a decoded adjusted frequency spectrum sequence) to be described later for all or a part of a high-side frequency sample sequence existing on a higher side than the predetermined frequency in the decoded extended frequency spectrum sequence obtained by the bandwidth extending part 25, as a frequency spectrum sequence of a decoded sound signal; and, otherwise, the fricative sound adjustment releasing part 23 immediately obtains the decoded extended frequency spectrum sequence obtained by the bandwidth extending part 25 as it is, as the frequency spectrum sequence of the decoded sound signal. In other words, if inputted information indicating whether a hissing sound or not indicates being a hissing sound, the decoding part 22 decodes a spectrum code to obtain a frequency-domain spectrum sequence (a decoded adjusted frequency spectrum sequence) on the assumption that bits are not assigned to a part on the low side of the spectrum code; and, otherwise, the decoding part 22 decodes the spectrum code to obtain a frequency-domain spectrum sequence (a decoded adjusted frequency spectrum sequence) on the assumption that bits are not assigned to a part on the high side of the spectrum code.

Though the decoding part 22 of the decoding apparatus of the first embodiment outputs an obtained decoded adjusted frequency spectrum sequence to the fricative sound adjustment releasing part 23, the decoding part 22 of the decoding apparatus of the second embodiment outputs an obtained decoded adjusted frequency spectrum sequence to the bandwidth extending part 25.

[Bandwidth Extending Part 25]

At least the bandwidth extension gain code outputted by the demultiplexing part 21 and the decoded adjusted frequency spectrum sequence outputted by the decoding part 22 are inputted to the bandwidth extending part 25. For each frame, the bandwidth extending part 25 obtains a decoded extended frequency spectrum sequence $\sim Y_0, \ldots, \sim Y_{N-1}$ as shown below at least based on the inputted bandwidth extension gain code and decoded adjusted frequency spectrum sequence, and outputs the obtained decoded extended frequency spectrum sequence $\sim Y_0, \ldots, \sim Y_{N-1}$ to the fricative sound adjustment releasing part 23 (step S25).

In the case of adopting a configuration in which only the bandwidth extension gain code and the decoded adjusted frequency spectrum sequence are inputted to the bandwidth extending part 25, the bandwidth extending part 25 obtains, for each frame, the decoded extended frequency spectrum sequence $\sim Y_0, \ldots, \sim Y_{N-1}$ based on the inputted bandwidth extension gain code and decoded adjusted frequency spectrum sequence and outputs the obtained decoded extended frequency spectrum sequence $\sim Y_0, \ldots, \sim Y_{N-1}$ to the fricative sound adjustment releasing part 23, for example, as in an example 1 below.

A configuration is also possible in which, in addition to the bandwidth extension gain code and the decoded adjusted frequency spectrum sequence, the fricative sound judgment information outputted by the demultiplexing part 21 is also inputted to the bandwidth extending part 25. In the case of adopting this configuration, as example 2 described below, for example, the bandwidth extending part 25 obtains, for each frame, the decoded extended frequency spectrum sequence $\sim Y_0, \ldots, \sim Y_{N-1}$ based on the inputted bandwidth extension gain code, decoded adjusted frequency spectrum sequence and fricative sound judgment information, and outputs the obtained decoded extended frequency spectrum sequence $\sim Y_0, \ldots, \sim Y_{N-1}$ to the fricative sound adjustment releasing part 23.

In the storing part 251 of the bandwidth extending part 25, the same plurality of pairs of a gain candidate vector, which is a candidate for a gain vector, and a code capable of identifying the gain candidate vector as stored in the storing part 161 of the bandwidth extension gain encoding part 16 of the encoding apparatus are stored in advance. Each gain candidate vector is configured with gain candidate values corresponding to a plurality of samples. The bandwidth extending part 25 obtains a sequence by what is obtained by causing values obtained by multiplying duplicate-source sample values, which are all or a part of decoded adjusted frequency spectra obtained by decoding a spectrum code (decoded adjusted frequency spectra corresponding to adjusted frequency spectra to which bits have been assigned by the encoding part 14 of the encoding apparatus) by bandwidth extension gains including in a gain candidate vector identified by a code corresponding to a bandwidth extension gain code, respectively, to be decoded extended frequency spectra corresponding to adjusted frequency spectra to which bits have not been assigned by the encoding part 14 of the encoding apparatus, and what is obtained by immediately causing the decoded adjusted frequency spectra obtained by decoding the spectrum code to be decoded extended frequency spectra, as a decoded extended frequency spectrum sequence.

Hereinafter, description will be made on an example of a case where the adjusted frequency spectra to which bits have been assigned by the encoding part 14 are the N-K adjusted frequency spectra $Y_0, \ldots, Y_{N-K-1}$ in ascending order of sample numbers in the adjusted frequency spectrum sequence $Y_0, \ldots, Y_{N-1}$, and the adjusted frequency spectra to which bits have not been assigned by the encoding part 14 are the K adjusted frequency spectra $Y_{N-K}, \ldots, Y_{N-1}$ in descending order of sample numbers in the adjusted frequency spectrum sequence $Y_0, \ldots, Y_{N-1}$. In other words, an example of a case where the decoded adjusted frequency spectrum sequence $\hat{Y}_0, \ldots, \hat{Y}_{N-K-1}$ is obtained by decoding a spectrum code will be described.

[Example 1 of Bandwidth Extending Part 25]

In this example, it is assumed that J pairs of a gain candidate vector and a code are stored in the storing part 251, and each gain candidate vector is configured with gain candidate values corresponding to K samples. Hereinafter, description will be made on the assumption that the J gain candidate vectors are indicated by $G_j$ (j=0, ..., J−1), codes corresponding to the gain candidate vectors $G_j$ (j=0, ..., J−1), respectively, are indicated by $C_{Gj}$ (j=0, ..., J−1), and each of the gain candidate vectors $G_j$ is configured with gain candidate values $g_{j,k}$ (k=0, ..., K−1) corresponding to K samples, that is, K gain candidate values $g_{j,k}$ (k=0, ..., K−1).

The bandwidth extending part 25 immediately causes the decoded adjusted frequency spectra $\hat{Y}_0, \ldots, \hat{Y}_{N-K-1}$ to be N-K decoded extended frequency spectra $\sim Y_0, \ldots, \sim Y_{N-K-1}$ in ascending order of sample numbers in the decoded extended frequency spectrum sequence. Further, the bandwidth extending part 25 obtains K gain candidate values included in a gain candidate vector that is equal to a bandwidth extension gain code in which corresponding codes $C_{Gj}$ are inputted, among the gain candidate vectors $G_j$ (j=0, ..., J−1) stored in the storing part 251, as bandwidth extension gains $g_0, \ldots, g_{K-1}$. Furthermore, the bandwidth extending part 25 causes values $\hat{Y}_{N-2K} g_0, \ldots, \hat{Y}_{N-K-1} g_{K-1}$ obtained by multiplying K decoded adjusted frequency spectra $\hat{Y}_{N-2K}, \ldots, \hat{Y}_{N-K-1}$ in descending order of sample numbers, among the decoded adjusted frequency spectra $\hat{Y}_0, \ldots, \hat{Y}_{N-K-1}$ by the bandwidth extension gains $g_0, \ldots, g_{K-1}$, respectively, to be K decoded extended frequency spectra $\sim Y_{N-K}, \ldots, \sim Y_{N-1}$ in descending order of sample numbers in the decoded extended frequency spectrum sequence.

[Example 2 of Bandwidth Extending Part 25]

In this example, it is assumed that, though J pairs of a gain candidate vector and a code are stored in the storing part 251 similarly to the example 1, two kinds, fricative sound gain candidate vectors and non-fricative sound gain candidate vectors, are stored as the gain candidate vectors unlike the example 1. In other words, it is assumed that J sets of a fricative sound gain candidate vector, a non-fricative sound gain candidate vector and a code are stored in the storing part 251, and each of the fricative sound gain candidate vectors and the non-fricative sound gain candidate vectors is configured with gain candidate values corresponding to K samples. Hereinafter, description will be made on the assumption that the J fricative sound gain candidate vectors are indicated by $G1_j$ (j=0, ..., J−1), the J non-fricative sound gain candidate vectors are indicated by $G2_j$ (j=0, ..., J−1), and codes corresponding to the fricative sound gain candidate vectors $G1_j$ (j=0, ..., J−1), respectively, and corresponding to the non-fricative sound gain candidate vectors $G2_j$ (j=0, ..., J−1), respectively, are indicated by $C_{Gj}$ (j=0, ..., J−1). Further, the description will be made on the assumption that each of the fricative sound gain candidate vectors $G1_j$ is configured with gain candidate values corresponding to K samples, that is, K gain candidate values $g1_{j,k}$ (k=0, ..., K−1), and each of the non-fricative sound gain candidate vectors $G2_j$ is configured with gain candidate values corresponding to K samples, that is, K gain candidate values $g2_{j,k}$ (k=0, ..., K−1).

The bandwidth extending part 25 immediately causes the decoded adjusted frequency spectra $\hat{Y}_0, \ldots, \hat{Y}_{N-K-1}$ to be N-K decoded extended frequency spectrum sequence $\sim Y_0, \ldots, \sim Y_{N-K-1}$ in ascending order of sample numbers in the decoded extended frequency spectrum sequence. Further, the bandwidth extending part 25 obtains K gain candidate values included in a gain candidate vector that is equal to a bandwidth extension gain code in which corresponding codes $C_{Gj}$ are inputted, among the gain candidate vectors $G_j$ (j=0, ..., J−1), as the bandwidth extension gains $g_0, \ldots, g_{K-1}$, with the fricative sound gain candidate vectors $G1_j$ (j=0, ..., J−1) stored in the storing part 251 used as the gain candidate vectors $G_j$ (j=0, ..., J−1) if the inputted fricative sound judgment information indicates being a hissing sound, and with the non-fricative sound gain candidate vectors $G2_j$ (j=0, ..., J−1) stored in the storing part 251 used as the gain candidate vectors $G_j$ (j=0, ..., J−1) if the inputted fricative sound judgment information indicates not being a hissing sound. Furthermore, the bandwidth extending part 25 causes values $\hat{Y}_{N-2K} g_0, \ldots, \hat{Y}_{N-K-1} g_{K-1}$ obtained by multiplying K decoded adjusted frequency spectra $\hat{Y}_{N-2K}, \ldots, \hat{Y}_{N-K-1}$ in descending order of sample numbers, among the decoded adjusted frequency spectra $\hat{Y}_0, \ldots, \hat{Y}_{N-K-1}$ by the bandwidth extension gains $g_0, \ldots, g_{K-1}$, respectively, to be K decoded extended frequency spectra $\sim Y_{N-K}, \ldots, \sim Y_{N-1}$ in descending order of sample numbers in the decoded extended frequency spectrum sequence.

[Modification 1 of Examples 1 and 2 of Bandwidth Extending Part 25]

In the examples 1 and 2 described above, decoded adjusted frequency spectra targeted by multiplication of bandwidth extension gains are the K adjusted frequency spectra $\hat{Y}_{N-2K}, \ldots, \hat{Y}_{N-K-1}$ in descending order of sample numbers, among the decoded adjusted frequency spectrum $\hat{Y}_0, \ldots, \hat{Y}_{N-K-1}$ obtained by decoding a spectrum code. However, the decoded adjusted frequency spectra targeted by multiplication of bandwidth extension gains are only required to be K decoded adjusted frequency spectra corresponding to K sample numbers determined in advance among the decoded adjusted frequency spectra $Y_0, \ldots, Y_{N-K-1}$ obtained by decoding a spectrum code.

[Modification 2 of Examples 1 and 2 of Bandwidth Extending Part 25]

In the examples 1 and 2 described above, the decoded adjusted frequency spectra $\hat{Y}_{N-2K+k}$ in ascending order of values of k and the bandwidth extension gains $g_k$ in ascending order of values of k are multiplied together to obtain the decoded extended frequency spectra $\sim Y_{N-K+k}$ in ascending order of values of k, that is, association in ascending order of values of k is performed. However, any association is possible if the association is determined in advance.

[Specific Example of Bandwidth Extending Part 25]

A specific example of the bandwidth extending part 25 in the case of N=32 and K=12 will be described. This specific example corresponds to a modification example 2 of the example 2 of the bandwidth extending part 25. FIGS. 13 and 14 show examples of processes of the bandwidth extending part 25 and the fricative sound adjustment releasing part 23 in the case of N=32 and K=12.

FIG. 13 shows an example of a case where the fricative sound judgment information indicates not being a hissing sound. The bandwidth extending part 25 immediately causes decoded adjusted frequency spectra $\hat{Y}_0, \ldots, \hat{Y}_{19}$ obtained by decoding a spectrum code to be decoded extended frequency spectra $\sim Y_0, \ldots, \sim Y_{19}$, as they are. Further, the bandwidth extending part 25 obtains twelve gain candidate values included in a gain candidate vector that is equal to a bandwidth extension gain code in which corresponding codes $C_{Gj}$ are inputted, as bandwidth extension gains $g_0, \ldots, g_{11}$. Furthermore, the bandwidth extending part 25 causes values $\hat{Y}_8 g_0, \ldots, \hat{Y}_{19} g_{11}$ obtained by multiplying twelve decoded adjusted frequency spectra $\hat{Y}_8, \ldots, \hat{Y}_{19}$ in descending order of sample numbers, among the decoded adjusted frequency spectra $\hat{Y}_0, \ldots, \hat{Y}_{19}$ by bandwidth extension gains $g_0, \ldots, g_{11}$, respectively, to be K decoded extended frequency spectra $\sim Y_{20}, \ldots, \sim Y_{31}$ in descending order of sample numbers in a decoded extended frequency spectrum sequence.

FIG. 14 shows an example of a case where the fricative sound judgment information indicates being a hissing sound. The bandwidth extending part 25 immediately causes decoded adjusted frequency spectra $\hat{Y}_0, \ldots, \hat{Y}_{19}$ obtained by decoding a spectrum code to be decoded extended frequency spectra $\sim Y_0, \ldots, \sim Y_{19}$, as they are. Further, the bandwidth extending part 25 obtains twelve gain candidate values included in a gain candidate vector that is equal to a bandwidth extension gain code in which corresponding codes $C_{Gj}$ are inputted, as bandwidth extension gains $g_0, \ldots, g_{11}$. Furthermore, the bandwidth extending part 25 causes values $\hat{Y}_8 g_0, \ldots, \hat{Y}_{19} g_{11}$ obtained by multiplying twelve decoded adjusted frequency spectra $\hat{Y}_8, \ldots, \hat{Y}_{19}$ in descending order of sample numbers, among the decoded adjusted frequency spectra $\hat{Y}_0, \ldots, \hat{Y}_{19}$ by bandwidth extension gains $g_0, \ldots, g_{11}$, respectively, to be K decoded extended frequency spectra $\sim Y_{24}, \ldots, \sim Y_{31}, \sim Y_{20}, \ldots, \sim Y_{23}$ in descending order of sample numbers in a decoded extended frequency spectrum sequence. In other words, the bandwidth extending part 25 performs a process for, with the 8th to 19th decoded adjusted frequency spectra $\hat{Y}_8, \ldots, \hat{Y}_{19}$ as duplication sources, causing what is obtained by arranging values $\hat{Y}_8 g_0, \ldots, \hat{Y}_{19} g_{11}$ obtained by multiplying values of the duplication-source decoded adjusted frequency spectra $\hat{Y}_8, \ldots, \hat{Y}_{19}$ by the bandwidth extension gains $g_0, \ldots, g_{11}$ in a manner that, after decoded extended frequency spectra $\sim Y_{20} = \hat{Y}_{16} g_8, \ldots, \sim Y_{23} = \hat{Y}_{19} g_{11}$ corresponding to the 16th to 19th sample numbers of the decoded adjusted frequency spectra, decoded extended frequency spectra $\sim Y_{24} = \hat{Y}_8 g_0, \ldots, \sim Y_{31} = \hat{Y}_{15} g_7$ corresponding to the 8th to 15th sample numbers of the decoded adjusted frequency spectra are located, to be the 20th to 31st decoded extended frequency spectra $\sim Y_{20}, \ldots, \sim Y_{31}$.

This operation of the bandwidth extending part 25 is associated with the operation of the fricative sound adjustment releasing part 23. In the example of FIG. 8, the fricative sound adjustment releasing part 23 causes the 20th to 23rd decoded extended frequency spectra $\sim Y_{20}, \ldots, \sim Y_{23}$ on the side with small sample numbers, among the 20th to 31st decoded extended frequency spectra $\sim Y_{20}, \ldots, \sim Y_{31}$ to be decoded frequency spectra $\hat{X}_{28}, \ldots, \hat{X}_{31}$ with the 28th to 31st sample numbers, and causes the 24th to 31st decoded extended frequency spectra $\sim Y_{24}, \ldots, \sim Y_{31}$ on the side with large sample numbers, among the 20th to 31st decoded extended frequency spectra $\sim Y_{20}, \ldots, \sim Y_{31}$, to be decoded frequency spectra $\hat{X}_2, \ldots, \hat{X}_8$ with the 2nd to 9th sample numbers. The bandwidth extending part 25 performs the operation in FIG. 14 in consideration of levels of frequencies of the decoded frequency spectra obtained by this operation of the fricative sound adjustment releasing part 23. In other words, the bandwidth extending part 25 of the decoding apparatus is adapted to perform a process that matches the levels of frequencies of decoded frequency spectra no matter whether the fricative sound judgment information indicates being a hissing sound or indicates not being a hissing sound.

In this way, the bandwidth extending part 25 obtains a decoded extended frequency spectrum sequence by arranging samples based on K samples (K is an integer equal to or larger than 2) included in a frequency-domain sample sequence obtained by the decoding part 22 decoding a spectrum code (a decoded adjusted frequency spectrum sequence) on a higher side than the frequency-domain sample sequence obtained by the decoding part 22 decoding the spectrum code (the decoded adjusted frequency spectrum sequence).

More specifically, for example, by decoding a bandwidth extension gain code to obtain a set by K bandwidth extension gains and arranging K samples obtained by multiplying K samples included in a frequency-domain sample sequence obtained by the decoding part 22 decoding a spectrum code (a decoded adjusted frequency spectrum sequence) by the K bandwidth extension gains, on a higher side than the frequency-domain sample sequence obtained by the decoding part 22 decoding the spectrum code, the bandwidth extending part 25 obtains a decoded extended frequency spectrum sequence.

Further, the process for, when it is assumed that a plurality of codes, fricative sound gain candidate vectors corresponding to the codes, respectively, and non-fricative sound gain candidate vectors corresponding to the codes, respectively, are stored in the bandwidth extending part 25 and that each of the fricative sound gain candidate vectors and the non-fricative sound gain candidate vectors includes K gain candidate values, the bandwidth extending part 25 to decode a bandwidth extension gain code to obtain a set by K bandwidth extension gains may be a process for causing K gain candidate values included in a fricative sound gain candidate vector the corresponding code of which is the same as the bandwidth extension gain code, among the plurality of fricative sound gain candidate vectors, to be a set of K bandwidth extension gains if inputted information indicating whether a hissing sound or not indicates being a hissing sound, and, otherwise, causing K gain candidate values included in a non-fricative sound gain candidate vector the corresponding code of which is the same as the bandwidth extension gain code, among the plurality of non-fricative sound gain candidate vectors, to be a set of K bandwidth extension gains.

[Fricative Sound Adjustment Releasing Part 23]

The fricative sound judgment information outputted by the demultiplexing part 21 and the decoded extended frequency spectrum sequence $\sim Y_0, \ldots, \sim Y_{N-1}$ outputted by the bandwidth extending part 25 are inputted to the fricative sound adjustment releasing part 23. For each frame, the fricative sound adjustment releasing part 23 performs the adjustment releasing process for the inputted decoded extended frequency spectrum sequence $\sim Y_0, \ldots, \sim Y_{N-1}$ to obtain a decoded frequency spectrum sequence $\hat{X}_0, \ldots, \hat{X}_{N-1}$, and outputs the obtained decoded frequency spectrum sequence $\hat{X}_0, \ldots, \hat{X}_{N-1}$ to the time domain converting part 24 if the inputted fricative sound judgment information indicates being a hissing sound; and the fricative sound adjustment releasing part 23 immediately outputs the decoded extended frequency spectrum sequence $\sim Y_0, \ldots, \sim Y_{N-1}$ as they are, as the decoded frequency spectrum sequence $\hat{X}_0, \ldots, \hat{X}_{N-1}$ to the time domain converting part 24 if the fricative sound judgment information indicates not being a hissing sound (step S23).

The adjustment releasing process performed by the fricative sound adjustment releasing part 23 is a process for performing a process similar to the process that the fricative sound adjustment releasing part 23 of the decoding apparatus of the first embodiment performs for the decoded adjusted frequency spectrum sequence $\hat{Y}_0, \ldots, \hat{Y}_{N-1}$, for the decoded extended frequency spectrum sequence $\sim Y_0, \ldots, \sim Y_{N-1}$. In other words, when an integer value larger than 1 and smaller than N is assumed to be M, and, for example, it is assumed that a sample group by $\sim Y_0, \ldots, \sim Y_{M-1}$, which are samples with sample numbers smaller than M in the decoded extended frequency spectrum sequence $\sim Y_0, \ldots, \sim Y_{N-1}$, is a low-side decoded extended frequency spectrum sequence, and a sample group by $\sim Y_M, \ldots, \sim Y_{N-1}$, which are samples with sample numbers equal to or larger than M in the decoded extended frequency spectrum sequence $\sim Y_0, \ldots, \sim Y_{N-1}$, is a high-side decoded extended frequency spectrum sequence, an adjustment releasing process that the fricative sound adjustment releasing part 23 performs when the fricative sound judgment information indicates being a hissing sound is a process for obtaining what is obtained by exchanging all or a part of samples of the low-side decoded extended frequency spectrum sequence $\sim Y_0, \ldots, \sim Y_{N-1}$ for all or a part of samples of the high-side decoded extended frequency spectrum sequence $\sim Y_M, \ldots, \sim Y_{N-1}$ as the decoded frequency spectrum sequence $\hat{X}_0, \ldots, \hat{X}_{N-1}$, the number of all or the part of the samples of the high-side decoded extended frequency spectrum sequence $\sim Y_M, \ldots, \sim Y_{N-1}$ being the same as the number of all or the part of the samples of the low-side decoded extended frequency spectrum sequence $\sim Y_0, \ldots, \sim Y_{N-1}$.

In other words, the fricative sound adjustment releasing part 23 may obtain what is obtained by exchanging all or a part of a low-side frequency sample sequence existing on a lower side than a predetermined frequency in a decoded extended frequency spectrum sequence obtained by the bandwidth extending part 25 for all or a part of a high-side frequency sample sequence existing on a higher side than the predetermined frequency in the decoded extended frequency spectrum sequence obtained by the bandwidth extending part 25 as a frequency spectrum sequence of a decoded sound signal (a decoded frequency spectrum sequence), the number of all or the part of the high-side frequency sample sequence being the same as the number of all or the part of the low-side frequency sample sequence, if inputted information indicating whether a hissing sound or not indicates being a hissing sound, and, otherwise, may immediately obtains the decoded extended frequency spectrum sequence obtained by the bandwidth extending part 25 as it is, as the frequency spectrum sequence of the decoded sound signal (a decoded frequency spectrum sequence).

If the bandwidth extending part 25 and the fricative sound adjustment releasing part 23 are assumed to constitute a fricative sound compatible bandwidth extending part 27 as indicated by a dot-dash line in FIG. 11, it can be said that the fricative sound compatible bandwidth extending part 27 performs bandwidth extension to a low side for a frequency-domain spectrum sequence obtained by the decoding part 22 (a decoded adjusted frequency spectrum sequence) to obtain a frequency spectrum sequence of a decoded sound signal (a decoded frequency spectrum sequence) if inputted information indicating whether a hissing sound or not indicates being a hissing sound, and, otherwise, performs bandwidth extension to a high side for the frequency-domain spectrum sequence obtained by the decoding part 22 to obtain a frequency spectrum sequence of a decoded sound signal (a decoded frequency spectrum sequence).

[Time Domain Converting Part 24]

For each frame, the time domain converting part 24 converts the decoded frequency spectrum sequence $\hat{X}_0, \ldots, \hat{X}_{N-1}$ to a time-domain signal using a method for conversion to a time domain corresponding to a method for conversion to a frequency domain performed by the frequency domain converting part 11 of the encoding apparatus to obtain a sound signal (a decoded sound signal) for each frame, and outputs the sound signal (step S24).

<<Operation and Effects>>

According to the encoding apparatus and the decoding apparatus of the second embodiment, by performing a fricative sound adjustment process and a fricative sound adjustment releasing process, bits are preferentially assigned to a high side in a hissing sound time section, and bits are preferentially assigned to a low side in other time sections, so that it is possible to reduce perceptual deterioration even for a sound signal including a fricative sound and the like, similarly to the encoding apparatus and the decoding apparatus of the first embodiment.

According to the encoding apparatus and the decoding apparatus of the second embodiment, by further reproducing low-side frequency spectra by duplication of high-side frequency spectra to extend a bandwidth, for a hissing sound time section, and reproducing high-side frequency spectra by duplication of low-side frequency spectra to extend a bandwidth, for other time sections, using bandwidth extension gains, it is possible to reduce perceptual deterioration even for a sound signal including a fricative sound and the like more than the first embodiment. In this case, by performing duplication in which frequency order is maintained, using bandwidth extension gains based on amplitudes of frequency spectra, the general shape of the original frequency spectra are reproduced as accurately as possible to enhance perceptual quality.

If the fricative sound judging part 12 of the modification of the first embodiment is used as the fricative sound judging part 12 of the encoding apparatus of the second embodiment, it is possible to restrict the judgment result of the fricative sound judging part 12 from frequently changing more, suppress occurrence frequency of discontinuity of the waveform of decoded sounds more and suppress deterioration of perceptual quality due to the discontinuity being felt more than a configuration in which the fricative sound judging part 12 of the first embodiment is used as the fricative sound judging part 12 of the encoding apparatus of the second embodiment.

[Program and Recording Medium]

Each of the encoding apparatus, the decoding apparatus and the fricative sound judgment apparatus may be realized by a computer. In this case, processing content of functions each of the encoding apparatus, the decoding apparatus and the fricative sound judgment apparatus should be provided with is written by a program. By the program being executed on the computer, each of the encoding apparatus, the decoding apparatus and the fricative sound judgment apparatus is realized on the computer.

The program in which the processing content is written can be recorded in a computer-readable recording medium. As the computer-readable recording medium, any computer-readable recording medium, for example, a magnetic recording apparatus, an optical disk, a magneto-optical recording medium, a semiconductor memory or the like is possible.

Processing of each part may be configured by causing a predetermined program to be executed on the computer, or at least a part of the processing may be realized as hardware.

It goes without saying that the present invention can be appropriately changed within a range not departing from the spirit of the invention.

What is claimed is:

1. An encoding apparatus comprising:
   processing circuitry configured to implement
   an encoding part encoding a frequency-domain sample sequence corresponding to a sound signal of each frame in a predetermined time section by an encoding process in which bits are preferentially assigned to a low side, to obtain a spectrum code;
a fricative sound judging part judging whether the sound signal is a hissing sound or not; and
a fricative sound adjusting part obtaining, if the fricative sound judging part judges that the sound signal is a hissing sound, what is obtained by exchanging all or a part of a low-side frequency spectrum sequence existing on a lower side than a predetermined frequency in a frequency spectrum sequence of the sound signal for all or a part of a high-side frequency spectrum sequence existing on a higher side than the predetermined frequency in the frequency spectrum sequence as an adjusted frequency spectrum sequence, the number of all or the part of the high-side frequency spectrum sequence being the same as the number of all or the part of the low-side frequency spectrum sequence, and, otherwise, immediately obtaining the frequency spectrum sequence corresponding to the sound signal as it is, as the adjusted frequency spectrum sequence; wherein
the encoding part encodes the adjusted frequency spectrum sequence obtained by the fricative sound adjusting part as the frequency-domain sample sequence corresponding to the sound signal to obtain a spectrum code.

2. The encoding apparatus according to claim 1, wherein, if the fricative sound judging part judges that the sound signal is a hissing sound, the fricative sound adjusting part obtains the adjusted frequency spectrum sequence by, on the assumption that the adjusted frequency spectrum sequence is configured with a low-side adjusted frequency spectrum sequence and a high-side adjusted frequency spectrum sequence, including a part of samples in the low-side frequency spectrum sequence into the high-side adjusted frequency spectrum sequence, arranging remaining samples left in the low-side frequency spectrum sequence, on a low side in the low-side adjusted frequency spectrum sequence, arranging a part of the samples in the high-side frequency spectrum sequence, on a high side in the low-side adjusted frequency spectrum sequence, and including remaining samples left in the high-side frequency spectrum sequence into the high-side adjusted frequency spectrum sequence.

3. The encoding apparatus according to claim 1, wherein, if the fricative sound judging part judges that the sound signal is a hissing sound, the fricative sound adjusting part obtains what is obtained by exchanging a part existing on a high side in the low-side frequency spectrum sequence for all or a part of the high-side frequency spectrum sequence, as the adjusted frequency spectrum sequence, the number of all or the part of the high-side frequency spectrum sequence being the same as the number of the part existing on the high side in the low-side frequency spectrum sequence.

4. The encoding apparatus according to claim 1, wherein, if the fricative sound judging part judges that the sound signal is a hissing sound, the fricative sound adjusting part obtains the adjusted frequency spectrum sequence by, on the assumption that the adjusted frequency spectrum sequence is configured with a low-side adjusted frequency spectrum sequence and a high-side adjusted frequency spectrum sequence, arranging a part of the samples in the low-side frequency spectrum sequence, on a high side in the high-side adjusted frequency spectrum sequence, including remaining samples left in the low-side frequency spectrum sequence into the low-side adjusted frequency spectrum sequence, including a part of the samples in the high-side frequency spectrum sequence into the low-side adjusted frequency spectrum sequence, and arranging remaining samples left in the high-side frequency spectrum sequence, on a low side in the high-side adjusted frequency spectrum sequence.

5. The encoding apparatus according to claim 1, wherein, if the fricative sound judging part judges that the sound signal is a hissing sound, the fricative sound adjusting part obtains what is obtained by exchanging all or a part of the low-side frequency spectrum sequence for a part existing on a low side in the high-side frequency spectrum sequence, as the adjusted frequency spectrum sequence, the number of the part existing on the low side in the high-side frequency spectrum sequence being the same as the number of all or the part of the low-side frequency spectrum sequence.

6. The encoding apparatus according to any one of claims 1 to 5, wherein, if such an index that increases as a ratio of average energy of frequency spectra on a high side to average energy of frequency spectra on a low side in the frequency spectrum sequence of the frame increases is larger than a predetermined threshold, or equal to or larger than the threshold, the fricative sound judging part judges that the sound signal is a hissing sound.

7. The encoding apparatus according to any one of claims 1 to 5, wherein, if, among a plurality of frames including the frame, the number of frames in which such an index that increases as a ratio of average energy of frequency spectra on a high side to average energy of frequency spectra on a low side in the frequency spectrum sequence increases is larger than a predetermined threshold, or equal to or larger than the threshold, is larger than the number of frames other than the frames, or equal to or larger than the number of the frames other than the frames, the fricative sound judging part judges that the sound signal is a hissing sound.

8. A decoding apparatus comprising:
processing circuitry configured to implement
a decoding part decoding a spectrum code which is a spectrum code for each frame in a predetermined time section and in which bits are preferentially assigned to a low side, to obtain a frequency-domain sample sequence corresponding to a decoded sound signal; and
a fricative sound adjustment releasing part obtaining, if inputted information indicating whether a hissing sound or not indicates being a hissing sound, what is obtained by exchanging all or a part of a low-side frequency sample sequence existing on a lower side than a predetermined frequency in the frequency-domain sample sequence obtained by the decoding part for all or a part of a high-side frequency sample sequence existing on a higher side than the predetermined frequency in the frequency-domain sample sequence obtained by the decoding part, as a frequency spectrum sequence of the decoded sound signal, the number of all or the part of the high-side frequency sample sequence being the same as the number of all or the part of the low-side frequency sample sequence and, otherwise, immediately obtaining the frequency-domain sample sequence obtained by the decoding part as it is, as the frequency spectrum sequence of the decoded sound signal.

9. An encoding method comprising an encoding step of encoding a frequency-domain sample sequence corresponding to a sound signal of each frame in a predetermined time section by an encoding process in which bits are preferentially assigned to a low side, to obtain a spectrum code, the encoding method further comprising:

a fricative sound judging step of judging whether the sound signal is a hissing sound or not; and a fricative sound adjusting step of obtaining, if the fricative sound judging step judges that the sound signal is a hissing sound, what is obtained by exchanging all or a part of a low-side frequency spectrum sequence existing on a lower side than a predetermined frequency in a frequency spectrum sequence of the sound signal for all or a part of a high-side frequency spectrum sequence existing on a higher side than the predetermined frequency in the frequency spectrum sequence as an adjusted frequency spectrum sequence, the number of all or the part of the high-side frequency spectrum sequence being the same as the number of all or the part of the low-side frequency spectrum sequence, and, otherwise, immediately obtaining the frequency spectrum sequence corresponding to the sound signal as it is, as the adjusted frequency spectrum sequence; wherein the encoding step encodes the adjusted frequency spectrum sequence obtained by the fricative sound adjusting step as the frequency-domain sample sequence corresponding to the sound signal to obtain a spectrum code.

10. A decoding method comprising a decoding step of decoding a spectrum code which is a spectrum code for each frame in a predetermined time section and in which bits are preferentially assigned to a low side, to obtain a frequency-domain sample sequence corresponding to a decoded sound signal, the decoding method further comprising a fricative sound adjustment releasing step of obtaining, if inputted information indicating whether a hissing sound or not indicates being a hissing sound, what is obtained by exchanging all or a part of a low-side frequency sample sequence existing on a lower side than a predetermined frequency in the frequency-domain sample sequence obtained by the decoding step for all or a part of a high-side frequency sample sequence existing on a higher side than the predetermined frequency in the frequency-domain sample sequence obtained by the decoding step, as a frequency spectrum sequence of the decoded sound signal, the number of all or the part of the high-side frequency sample sequence being the same as the number of all or the part of the low-side frequency sample sequence, and, otherwise, immediately obtaining the frequency-domain sample sequence obtained by the decoding step as it is, as the frequency spectrum sequence of the decoded sound signal.

11. A non-transitory computer-readable recording medium in which a program for causing a computer to function as each part of the encoding apparatus according to any of claims 1 to 5 is recorded.

12. A non-transitory computer-readable recording medium in which a program for causing a computer to function as each part of the decoding apparatus according to claim 8 is recorded.

* * * * *